US009024985B2

(12) United States Patent
Ohno

(10) Patent No.: US 9,024,985 B2
(45) Date of Patent: May 5, 2015

(54) LIGHT-EMITTING COMPONENT, PRINT HEAD, IMAGE FORMING APPARATUS AND METHOD OF MANUFACTURING LIGHT-EMITTING COMPONENT

(71) Applicant: Fuji Xerox Co., Ltd., Minato-ku, Tokyo (JP)

(72) Inventor: Seiji Ohno, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 14/178,614

(22) Filed: Feb. 12, 2014

(65) Prior Publication Data

US 2014/0320579 A1 Oct. 30, 2014

(30) Foreign Application Priority Data

Apr. 24, 2013 (JP) ................. 2013-091809

(51) Int. Cl.
| | |
|---|---|
| *B41J 2/39* | (2006.01) |
| *H01L 33/00* | (2010.01) |
| *G03G 15/04* | (2006.01) |
| *H01L 27/15* | (2006.01) |

(52) U.S. Cl.
CPC ........ *H01L 33/005* (2013.01); *G03G 15/04054* (2013.01); *H01L 27/153* (2013.01)

(58) Field of Classification Search
CPC ..... H01L 27/15; H01L 27/153; H01L 27/156; H01L 33/005; G03G 15/04054
USPC .............................. 347/79, 118, 141; 257/79
See application file for complete search history.

(56) References Cited

U.S. PATENT DOCUMENTS

| | | | |
|---|---|---|---|
| 5,451,977 A | 9/1995 | Kusuda et al. | |
| 5,814,841 A | 9/1998 | Kusuda et al. | |
| 6,180,960 B1* | 1/2001 | Kusuda et al. | ................. 257/91 |
| 6,717,182 B1* | 4/2004 | Tagami et al. | ................. 257/83 |
| 8,134,178 B2* | 3/2012 | Ohno | ............................ 257/157 |

FOREIGN PATENT DOCUMENTS

JP            2784011 B2     8/1998

* cited by examiner

*Primary Examiner* — Alessandro Amari
*Assistant Examiner* — Michael Konczal
(74) *Attorney, Agent, or Firm* — Sughrue Mion, PLLC

(57) ABSTRACT

A light-emitting component includes: plural light-emitting thyristors, each including a semiconductor layer stack laminating first to fourth semiconductor layers in order, and emitting light at a predetermined wavelength in an ON state; plural transfer thyristors, each including the semiconductor layer stack, the plural transfer thyristors shifting to the ON state for transferring the ON state to set corresponding light-emitting thyristors in a light-enabled state; and plural coupling transistors, each including the first to third semiconductor layers in the semiconductor layer stack and provided to couple former and latter transfer thyristors, the first and second semiconductor layers of each coupling transistor being continued to the first and second semiconductor layers of the former transfer thyristor, and the third semiconductor layer of each coupling transistor being continued to the third semiconductor layer of the former transfer thyristor with a thickness to be depleted in a state where no voltage is applied.

5 Claims, 12 Drawing Sheets

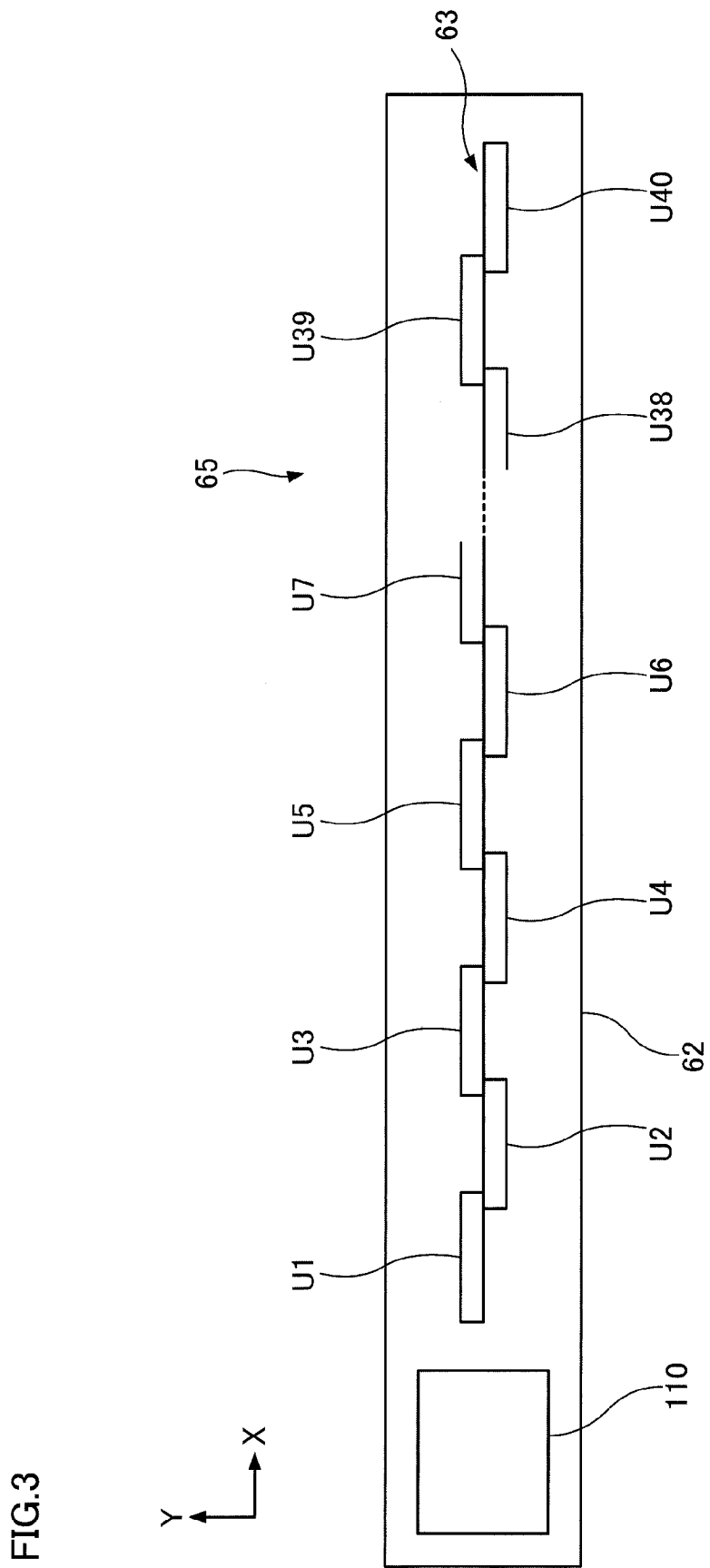

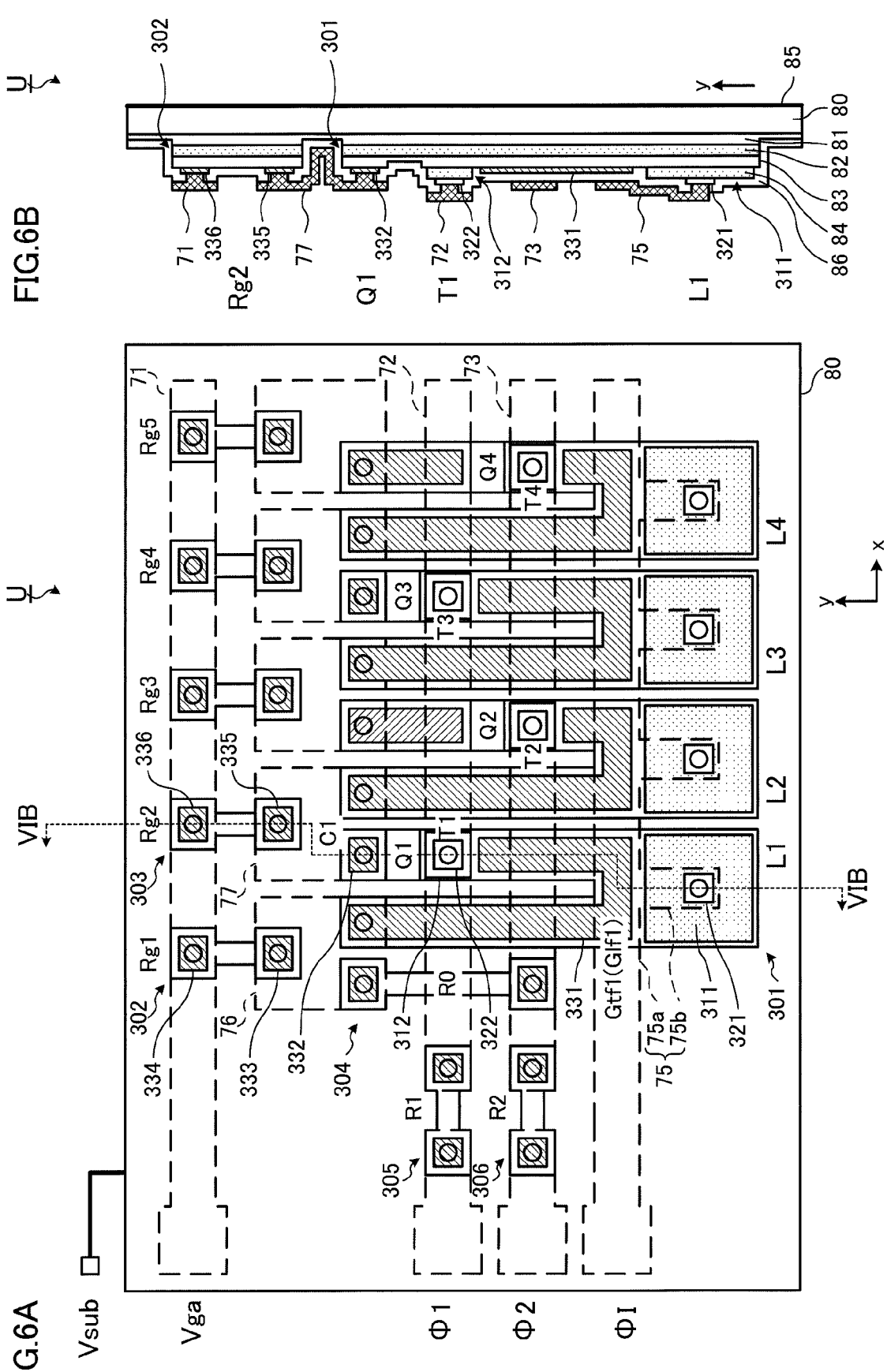
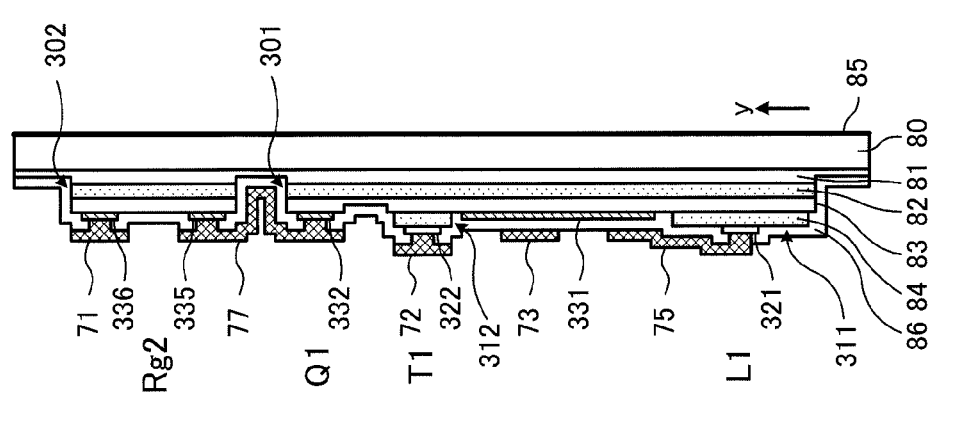

LIGHT-EMITTING COMPONENT, PRINT HEAD, IMAGE FORMING APPARATUS AND METHOD OF MANUFACTURING LIGHT-EMITTING COMPONENT

CROSS REFERENCE TO RELATED APPLICATIONS

This application is based on and claims priority under 35 USC §119 from Japanese Patent Application 2013-091809 filed Apr. 24, 2013.

BACKGROUND

1. Technical Field

The present invention relates to a light-emitting component, a print head, an image forming apparatus and a method of manufacturing the light-emitting component.

2. Related Art

In an electrophotographic image forming apparatus such as a printer, a copying machine or a facsimile machine, an image is formed on a recording sheet as follows. Firstly, an electrostatic latent image is formed on a charged photoconductor by causing an optical recording unit to emit light of a predetermined wavelength so as to transfer image information onto the photoconductor. Then, the electrostatic latent image is made visible by being developed with toner. Lastly, the toner image is transferred on and fixed to the recording sheet. In addition to an optical-scanning recording unit that performs exposure by laser scanning in the fast scanning direction using a laser beam, a recording device using the following LED print head (LPH) has been employed as such an optical recording unit in recent years in response to demand for downsizing the apparatus. This LPH includes plural light-emitting diodes (LEDs), serving as light-emitting elements, arrayed in the fast scanning direction.

In addition, in a light-emitting chip that mounts a self-scanning type light-emitting element array (SLED) in which plural light-emitting elements are provided in lines on a substrate and subjected to successive lighting control, light-emitting thyristors are used as the light-emitting elements.

SUMMARY

According to an aspect of the present invention, there is provided a light-emitting component including: plural light-emitting thyristors, each configured with a semiconductor layer stack in which a first semiconductor layer of a first conduction type, a second semiconductor layer of a second conduction type, which is different from the first conduction type, a third semiconductor layer of the first conduction type and a fourth semiconductor layer of the second conduction type are laminated in order, each of the plural light-emitting thyristors emitting light at a predetermined wavelength in an ON state; plural transfer thyristors, each configured with the semiconductor layer stack, the plural transfer thyristors shifting to the ON state in order so as to transfer the ON state, to thereby set corresponding light-emitting thyristors in a light-enabled state in the plural light-emitting thyristors; and plural coupling transistors, each configured with the first semiconductor layer, the second semiconductor layer and the third semiconductor layer in the semiconductor layer stack, provided to couple a former transfer thyristor and a latter transfer thyristor that are adjacent in order that the plural transfer thyristors sequentially shift to the ON state, and shifting to the ON state affected by the former transfer thyristor shifting to the ON state, the first semiconductor layer and the second semiconductor layer of each coupling transistor being continued to the first semiconductor layer and the second semiconductor layer of the former transfer thyristor and the third semiconductor layer of each coupling transistor being continued to the third semiconductor layer of the former transfer thyristor with a thickness to be depleted in a state where no voltage is applied.

BRIEF DESCRIPTION OF THE DRAWINGS

Exemplary embodiments of the present invention will be described in detail based on the following figures, wherein:

FIG. 3 is a top view of a light-emitting device;

FIGS. 6A and 6B are specific examples of a layout plan view and a cross-sectional view of the light-emitting chip to which the first exemplary embodiment is applied;

DETAILED DESCRIPTION

Hereinafter, a description will be given of an exemplary embodiment of the present invention in detail with reference to the accompanying drawings.

First Exemplary Embodiment (Image Forming Apparatus 1)

Figure 1:
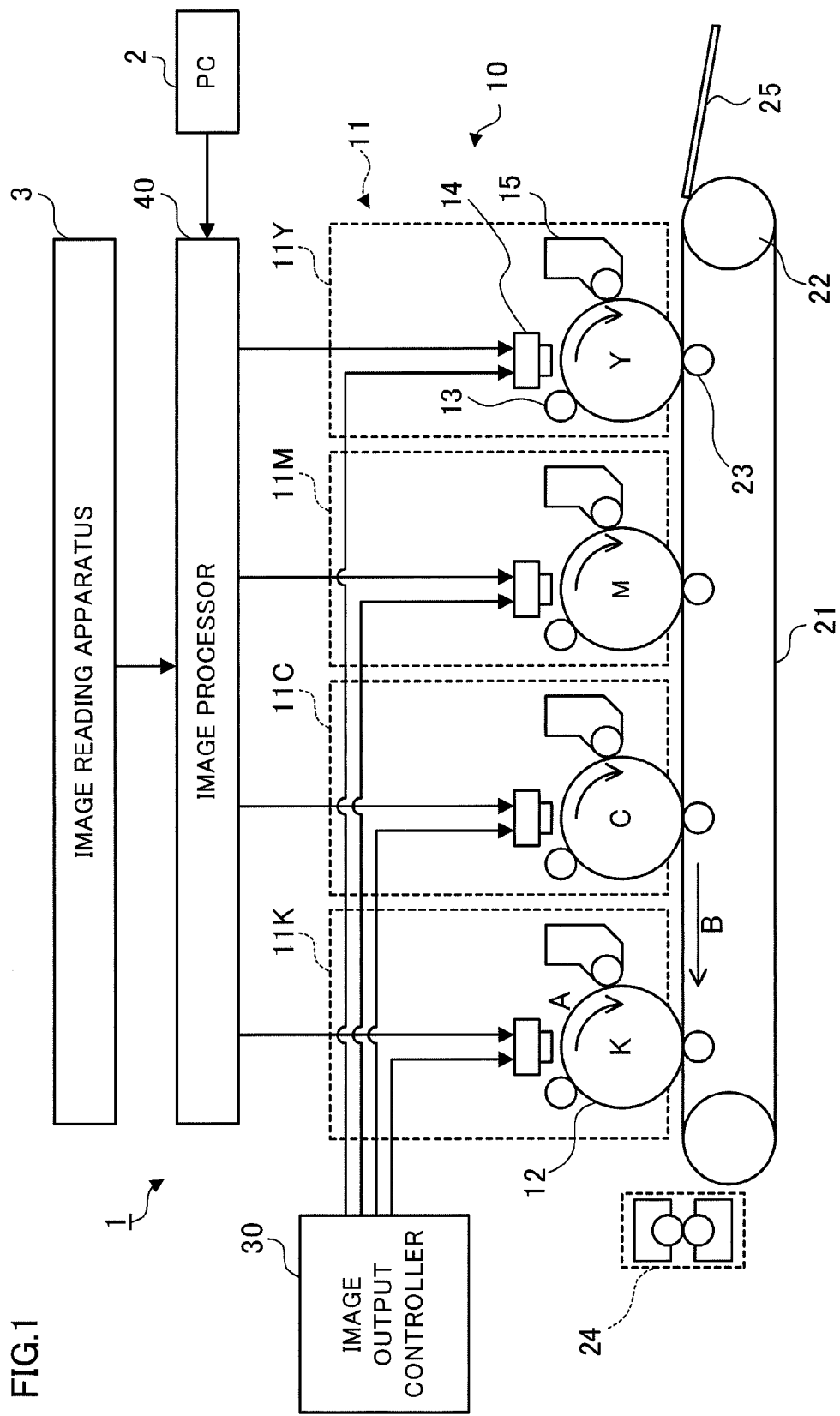
FIG. 1 is a diagram showing a specific example of an overall configuration of an image forming apparatus to which a first exemplary embodiment is applied.

FIG. 1 is a diagram showing a specific example of an overall configuration of an image forming apparatus 1 to which the first exemplary embodiment is applied. The image forming apparatus 1 shown in FIG. 1 is what is generally termed as a tandem image forming apparatus. The image forming apparatus 1 includes an image forming process unit 10, an image output controller 30 and an image processor 40. The image forming process unit 10 forms an image in accordance with different color image data. The image output controller 30 controls the image forming process unit 10. The image processor 40, which is connected to devices such as a personal computer (PC) 2 and an image reading apparatus 3, performs predefined image processing on image data received from the above devices.

The image forming process unit 10 includes image forming units 11 formed of plural engines arranged in parallel at intervals set in advance. The image forming units 11 are formed of four image forming units 11Y, 11M, 11C and 11K. Each of the image forming units 11Y, 11M, 11C and 11K includes a photoconductive drum 12, a charging device 13, a print head 14 and a developing device 15. On the photoconductive drum 12, which is a specific example of an image carrier, an electrostatic latent image is formed, and the photoconductive drum 12 retains a toner image. The charging device 13, as a specific example of a charging unit, charges the surface of the photoconductive drum 12 at a predetermined potential. The print head 14 exposes the photoconductive drum 12 charged by the charging device 13. The developing device 15, as a specific example of a developing unit, develops an electrostatic latent image formed by the print head 14. The image forming units 11Y, 11M, 11C and 11K form yellow (Y), magenta (M), cyan (C) and black (K) toner images, respectively.

In addition, the image forming process unit 10 further includes a sheet transport belt 21, a drive roll 22, transfer rolls 23 and a fixing device 24. The sheet transport belt 21 transports a recording sheet 25 as a transferred body so that different color toner images respectively formed on the photoconductive drums 12 of the image forming units 11Y, 11M, 11C and 11K are transferred on the recording sheet 25 by multilayer transfer. The drive roll 22 is a roll that drives the sheet transport belt 21. Each transfer roll 23, as a specific example of a transfer unit, transfers a toner image formed on the corresponding photoconductive drum 12 onto the recording sheet 25. The fixing device 24 fixes the toner images on the recording sheet 25.

In this image forming apparatus 1, the image forming process unit 10 performs an image forming operation on the basis of various kinds of control signals supplied from the image output controller 30. Under the control by the image output controller 30, the image data received from the personal computer (PC) 2 or the image reading apparatus 3 is subjected to image processing by the image processor 40, and then the resultant data is supplied to the corresponding image forming unit 11. Then, for example in the black (K) color image forming unit 11K, the photoconductive drum 12 is charged at a predetermined potential by the charging device 13 while rotating in an arrow A direction, and then is exposed by the print head 14 emitting light on the basis of the image data supplied from the image processor 40. By this operation, the electrostatic latent image for the black (K) color image is formed on the photoconductive drum 12. Thereafter, the electrostatic latent image formed on the photoconductive drum 12 is developed by the developing device 15, and accordingly the black (K) color toner image is formed on the photoconductive drum 12. Yellow (Y), magenta (M) and cyan (C) color toner images are also formed in the image forming units 11Y, 11M and 11C, respectively.

The respective color toner images on the photoconductive drums 12, which are formed in the respective image forming units 11, are electrostatically transferred to the recording sheet 25 supplied with the movement of the sheet transport belt 21 by a transfer electric field applied to the transfer rolls 23, in sequence. Here, the sheet transport belt 21 moves in an arrow B direction. By this operation, a synthetic toner image, which is superimposed color-toner images, is formed on the recording sheet 25.

Thereafter, the recording sheet 25 on which the synthetic toner image is electrostatically transferred is transported to the fixing device 24. The synthetic toner image on the recording sheet 25 transported to the fixing device 24 is fixed on the recording sheet 25 through fixing processing using heat and pressure by the fixing device 24, and then is outputted from the image forming apparatus 1.

(Print Head 14)

Figure 2:
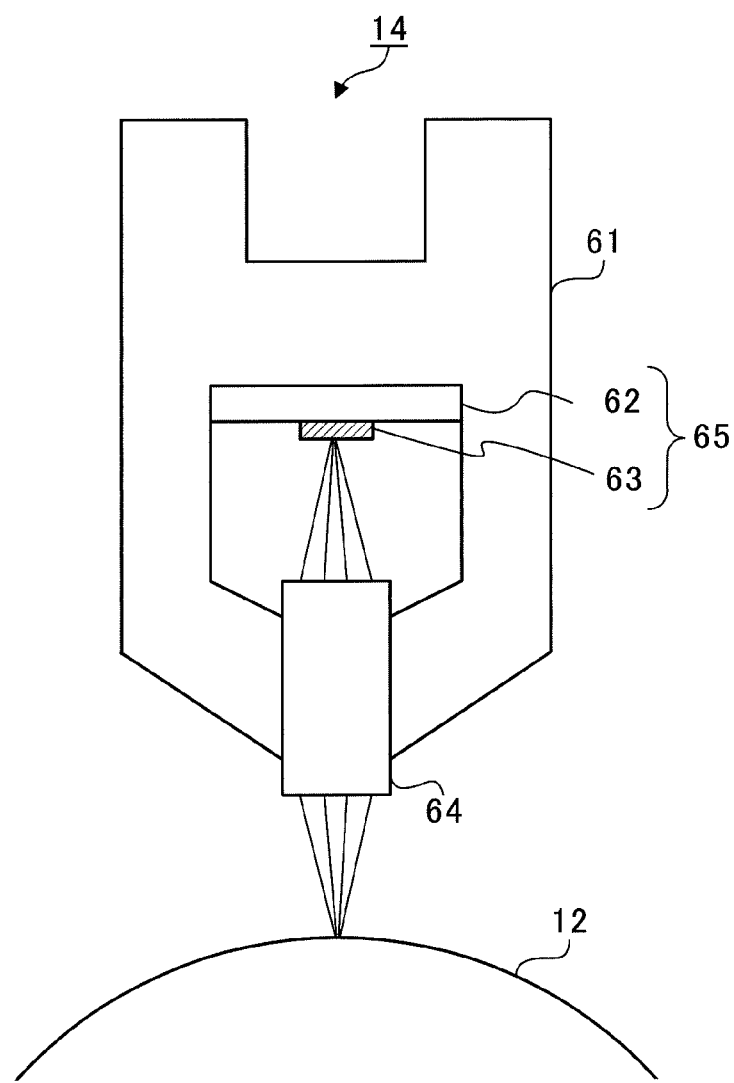
FIG. 2 is a cross-sectional view showing a configuration of a print head.

FIG. 2 is a cross-sectional view showing a configuration of the print head 14. The print head 14, as a specific example of an exposure unit, includes a housing 61, a light-emitting device 65 and a rod lens array 64. The light-emitting device 65, as a specific example of a light-emitting unit, includes a light source portion 63 formed of plural light-emitting elements (light-emitting thyristors in the first exemplary embodiment) that exposes the photoconductive drum 12. The rod lens array 64, as a specific example of an optical unit, focuses light emitted by the light source portion 63 onto the surface of the photoconductive drum 12.

The light-emitting device 65 also includes a circuit board 62 on which the above-described light source portion 63, a signal generating circuit 110 (refer to FIG. 3, which will be described later) driving the light source portion 63 and the like are mounted.

The housing 61 is made of metal, for example, and supports the circuit board 62 and the rod lens array 64. The housing 61 is set so that the light-emitting surfaces of the light-emitting elements in the light-emitting portions 63 (surfaces of regions 311 in FIGS. 6A and 6B, which will be described later) are located on the focal plane of the rod lens array 64. In addition, the rod lens array 64 is arranged along an axial direction of the photoconductive drum 12 (the fast scanning direction and also X direction in FIG. 3 and FIG. 4B).

FIG. 3 is a top view of the light-emitting device 65.

In the light-emitting device 65 shown as a specific example in FIG. 3, the light source portion 63 is configured with forty light-emitting chips U1 to U40, as a specific example of a light-emitting component which are arranged on the circuit board 62 in two lines in the X direction, which is the fast scanning direction, in a staggered manner.

In this specification, "to" in, for example, "U1 to U40" as described above is used for representing plural constituents distinguished by numbers, and means to include constituents located both prior to and subsequent to "to" and constituents having numbers therebetween. For example, "light-emitting chips U1 to U40" includes from the light-emitting chip U1 up to the light-emitting chip U40 in numerical order.

The configurations of the light-emitting chips U1 to U40 may be the same with each other. Thus, the light-emitting chips U1 to U40, when not separately distinguished, are labeled as light-emitting chips U.

It should be noted that, though the number of the light-emitting chips U is forty in total in the first exemplary embodiment, the configuration is not limited to this.

In addition, the light-emitting device 65 has the signal generating circuit 110 that drives the light source portion 63. The signal generating circuit 110 is configured with, for example, an integrated circuit (IC) or the like. It should be noted that the light-emitting device 65 may not be provided with the signal generating circuit 110. In such a case, the signal generating circuit 110 is provided at the outside of the light-emitting device 65, and a control signal for controlling the light-emitting chips U1 to U40 is supplied to the light-emitting device 65 via a cable or the like. However, here, a description will be given on the assumption that the light-emitting device 65 has the signal generating circuit 110.

An arrangement of the light-emitting chips U1 to U40 will be described in detail later.

Figure 4A:
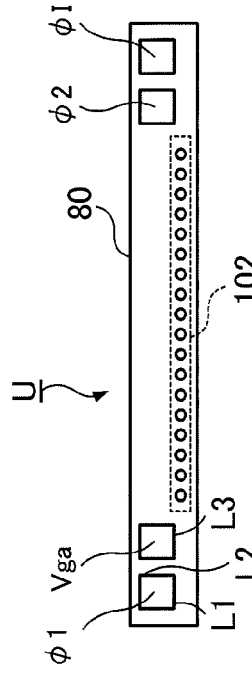
FIGS. 4A and 4B are diagrams showing a configuration of a light-emitting chip, a configuration of a signal generating circuit of the light-emitting device and a wiring (line) configuration on a circuit board.
Figure 4B:
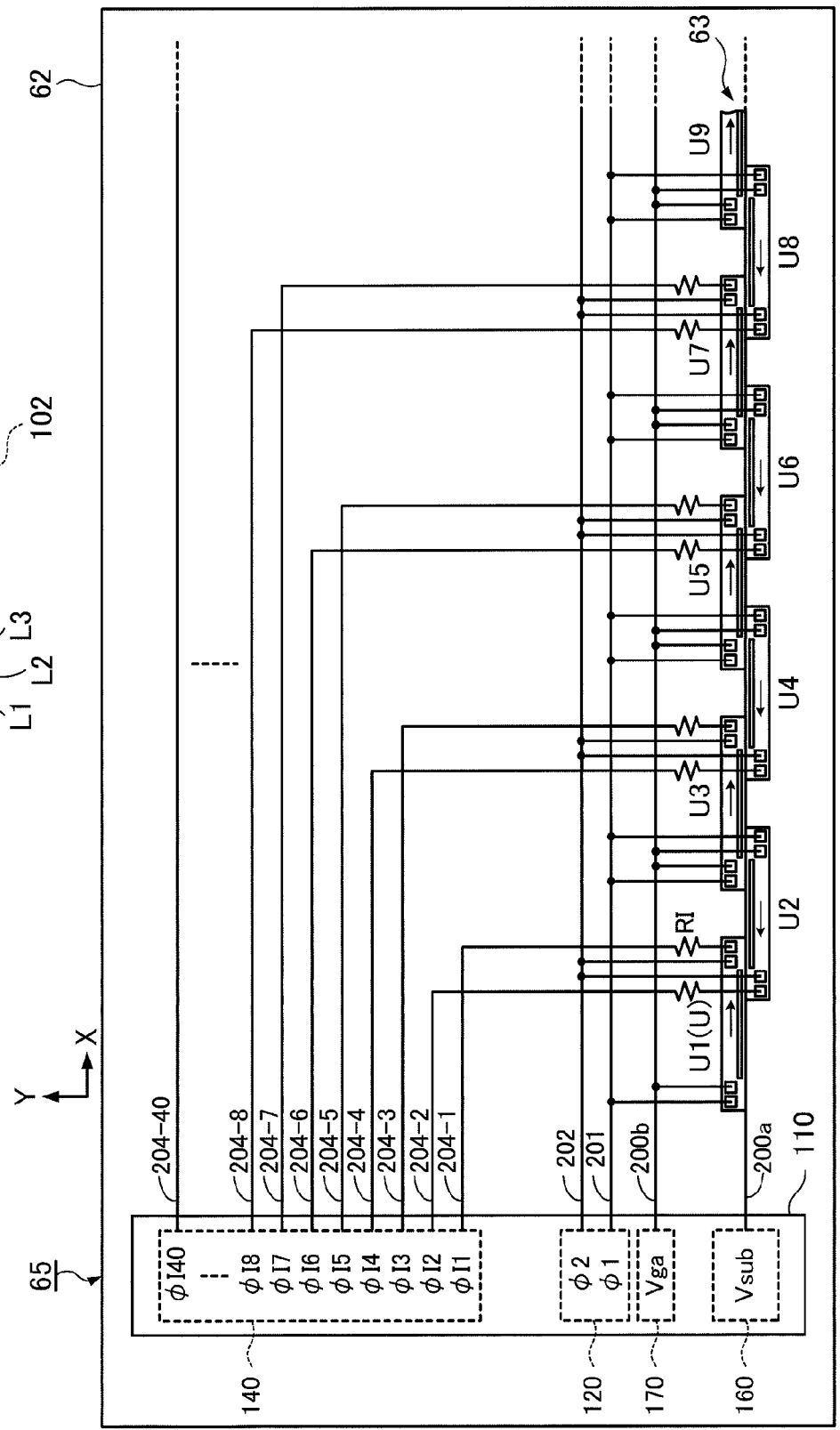

FIGS. 4A and 4B are diagrams showing a configuration of a light-emitting chip U, a configuration of the signal generating circuit 110 of the light-emitting device 65 and a wiring (line) configuration on the circuit board 62. FIG. 4A shows the configuration of the light-emitting chip U, and FIG. 4B shows the configuration of the signal generating circuit 110 of the light-emitting device 65, and the wiring (line) configuration on the circuit board 62.

First, the configuration of the light-emitting chip U shown in FIG. 4A will be described.

The light-emitting chip U includes a light-emitting portion 102 that includes multiple light-emitting elements (light-emitting thyristors L1, L2, L3, . . . , in the first exemplary embodiment) provided in line along the longitudinal side of one of longitudinal sides on a surface of a substrate 80 having a rectangular surface shape. The light-emitting chip U also includes terminals (φ1 terminal, φ2 terminal, Vga terminal and φI terminal) at both ends in the longitudinal direction of the substrate 80, the terminals being multiple bonding pads to receive various kinds of control signals. It should be noted that these terminals are provided in the order of the φ1 terminal and the Vga terminal from one end of the substrate 80, and are provided in the order of the φI terminal and the φ2 terminal from the other end of the substrate 80. The light-emitting portion 102 is provided between the Vga terminal and the φ2 terminal. Further, on a rear surface of the substrate 80, a back-side electrode 85 (refer to FIG. 6B, which will be described later) is provided as a Vsub terminal.

It should be noted that "in line" is not limited to a case where the plural light-emitting elements are provided on a single straight line as shown in FIG. 4A, but may allow each light-emitting element of the plural light-emitting elements to be arranged with a shifting amount that is different from one another with respect to a direction perpendicular to the line direction. For example, when the light-emitting surface of the light-emitting element (the surface of the region 311 in FIGS. 6A and 6B, which will be described later) is assumed to be a pixel, each light-emitting element may be arranged with a shifting amount of several pixels or some tens of pixels with respect to the direction perpendicular to the line direction. Moreover, adjacent light-emitting elements or groups of plural light-emitting elements may be alternately arranged in the staggered manner.

Next, the configuration of the signal generating circuit 110 of the light-emitting device 65 and the wiring (line) configuration on the circuit board 62 are described with reference to FIG. 4B.

As described above, the circuit board 62 of the light-emitting device 65 is mounted with the signal generating circuit 110 and light-emitting chips U1 to U40, and wiring (line) to connect between the signal generating circuit 110 and the light-emitting chips U1 to U40 is provided.

First, the configuration of the signal generating circuit 110 is described.

The signal generating circuit 110 receives input of image-processed image data and various kinds of control signals from an image output controller 30 and an image processor 40 (refer to FIG. 1). The signal generating circuit 110 rearranges the image data and corrects amount of light based on these image data and various kinds of control signals.

The signal generating circuit 110 includes a transfer signal generating part 120 that transmits a first transfer signal φ1 and a second transfer signal φ2 to the light-emitting chips U1 to U40 based on various kinds of control signals.

Moreover, the signal generating circuit 110 further includes a light-up signal generating part 140 that transmits light-up signals φI1 to φI40 to the light-emitting chips U1 to U40, respectively, based on various kinds of control signals. It should be noted that the light-up signals φI1 to φI40, when not separately distinguished, are labeled as a light-up signal φI.

Still further, the signal generating circuit 110 includes a reference potential supply portion 160 that supplies a reference potential Vsub, which serves as a reference of potential, to the light-emitting chips U1 to U40 and a power supply potential supply portion 170 that supplies a power supply potential Vga for driving the light-emitting chips U1 to U40.

Next, an arrangement of the light-emitting chips U1 to U40 will be described.

Odd numbered light-emitting chips U1, U3, U5, . . . are arranged in line at intervals along the longitudinal side direction of each substrate 80. Similarly, even numbered light-emitting chips U2, U4, U6, . . . are arranged in line at intervals along the longitudinal side direction of each substrate 80. The odd numbered light-emitting chips U1, U3, U5, . . . and the even numbered light-emitting chips U2, U4, U6, . . . are arranged in a staggered pattern in a state of being rotated at 180° with each other so that the longitudinal sides on the light-emitting portion 102 side provided in the light-emitting chips U face each other. The light-emitting chips U are set so that the light-emitting elements are arranged at predetermined intervals in the fast scanning direction (the X direction). It should be noted that, in the light-emitting chips U1, U2, U3, . . . in FIG. 4B, directions of arrangements of the light-emitting elements in the light-emitting portion 102 shown in FIG. 4A (in the first exemplary embodiment, the numerical order of the light-emitting thyristors L1, L2, L3, . . . ) are indicated by arrows.

The wiring (line) to connect between the signal generating circuit 110 and the light-emitting chips U1 to U40 will be described.

The circuit board 62 is provided with a power supply line 200a that is connected to the back-side electrode 85 (refer to FIG. 6B to be described later) provided to the rear surface of the substrate 80 of the light-emitting chip U, which is the Vsub terminal, to supply the reference potential Vsub.

The circuit board 62 is also provided with a power supply line 200b that is connected to the Vga terminal provided to each light-emitting chip U to supply a power supply potential Vga for driving.

The circuit board 62 is also provided with a first transfer signal line 201 to transmit a first transfer signal φ1 from the transfer signal generating part 120 of the signal generating circuit 110 to the φ1 terminals of the light-emitting chips U1 to U40 and a second transfer signal line 202 to transmit a second transfer signal φ2 to the φ2 terminals of the light-emitting chips U1 to U40.

Moreover, the circuit board 62 includes a light-up signal lines 204-1 to 204-40 to transmit light-up signals φI1 to φI40 from the light-up signal generating part 140 of the signal generating circuit 110 to φI terminals of the light-emitting chips U1 to U40 via current limitation resistances RI, respectively.

The reference potential Vsub and the power supply potential Vga are supplied to all the light-emitting chips U1 to U40 on the circuit board 62 in common. The first transfer signal φ1 and the second transfer signal φ2 are also transmitted to the light-emitting chips U1 to U40 in common (in parallel). On the other hand, the light-up signals φI1 to φI40 are separately transmitted to the light-emitting chips U1 to U40, respectively.

It should be noted that, in a case where the light-emitting device 65 is not provided with the signal generating circuit 110, in the light-emitting device 65, the power supply lines 200a and 200b, the first transfer signal line 201, the second transfer signal line 202 and the light-up signal lines 204-1 to 204-40 are connected to a connector or the like instead of the signal generating circuit 110, and then connected to the signal generating circuit 110 provided at the outside via a cable connected to the connector or the like.

(Light-Emitting Chip U)

Figure 5:
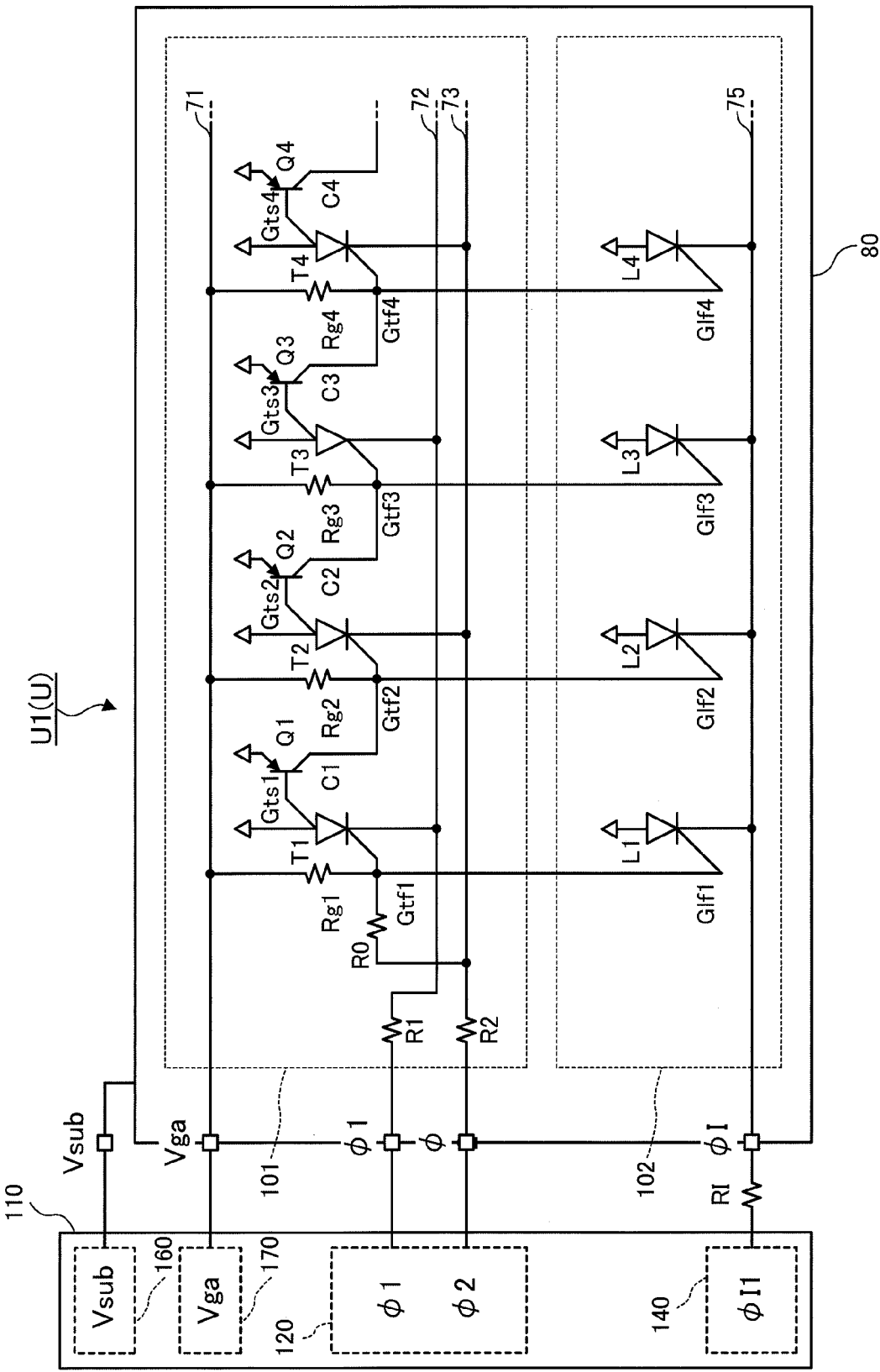
FIG. 5 is an equivalent circuit diagram for illustrating a circuit configuration of the light-emitting chip that mounts a self-scanning type light-emitting element array (SLED) to which the first exemplary embodiment is applied.

FIG. 5 is an equivalent circuit diagram for illustrating the circuit configuration of the light-emitting chip U on which a self-scanning type light-emitting element array (SLED) is mounted, to which the first exemplary embodiment is applied. Each element described below, except for the terminals (the $\phi1$ terminal, the $\phi2$ terminal, the Vga terminal and the $\phi I$ terminal), is arranged based on the layout on each light-emitting chip U (refer to FIGS. 6A and 6B to be described later). It should be noted that the terminals (the $\phi1$ terminal, the $\phi2$ terminal, the Vga terminal and the $\phi I$ terminal), although shown at different positions from those in FIG. 4A, are shown at the left end of FIG. 5 for convenience of description. The Vsub terminal provided on the rear surface of the substrate 80 is illustrated to be drawn out of the substrate 80.

Here, the light-emitting chips U are described by using the light-emitting chip U1 as a specific example in relation with the signal generating circuit 110. Thus, in FIG. 5, the light-emitting chip U is denoted as the light-emitting chip U1 (U). The configurations of other light-emitting chips U2 to U40 are the same as that of the light-emitting chip U1.

As described above, the light-emitting chip U1 (U) includes the light-emitting thyristor array (the light-emitting portion 102 (refer to FIG. 4A)) that includes the light-emitting thyristors L1, L2, L3, ... arranged in line on the substrate 80.

The light-emitting chip U1 (U) also includes a transfer thyristor array configured with transfer thyristors T1, T2, T3, ... arranged in line in a similar manner as the light-emitting thyristor array.

Moreover, the light-emitting chip U1 (U) includes coupling transistors Q1, Q2, Q3, ..., which are pnp bipolar transistors, and are located between respective pairs of two adjacent transfer thyristors, taken sequentially from T1, T2, T3, ....

Further, the light-emitting chip U1 (U) includes power supply line resistances Rg1, Rg2, Rg3, ....

The light-emitting chip U1 (U) includes one start resistance R0. The light-emitting chip U1 (U) further includes current limitation resistances R1 and R2 to prevent excess current from flowing through a first transfer signal line 72 for transmitting a first transfer signal $\phi1$, and a second transfer signal line 73 for transmitting a second transfer signal $\phi2$, which will be described later.

The light-emitting thyristors L1, L2, L3, ..., in the light-emitting thyristor array, and the transfer thyristors T1, T2, T3, ..., in the transfer thyristor array are arranged in the numerical order from the left in FIG. 5. Similarly, the coupling transistors Q1, Q2, Q3, ..., and the power supply line resistances Rg1, Rg2, Rg3, ..., are also arranged in the numerical order from the left in FIG. 5.

The light-emitting thyristor array and the transfer thyristor array are arranged in the order of the transfer thyristor array and the light-emitting thyristor array from the top to the bottom in FIG. 5.

Here, the light-emitting thyristors L1, L2, L3, ..., the transfer thyristors T1, T2, T3, ..., the coupling transistors Q1, Q2, Q3, ..., and the power supply line resistances Rg1, Rg2, Rg3, ..., when not distinguished, are denoted as a light-emitting thyristor L, a transfer thyristor T, a coupling transistor Q and a power supply line resistance R, respectively.

The number of the light-emitting thyristors L in the light-emitting thyristor array may be a predetermined number. In the first exemplary embodiment, if the number of the light-emitting thyristors L is 128, the number of transfer thyristors T is also 128. Similarly, the number of the power supply line resistances Rg is also 128. However, the number of the coupling transistors Q is 1 less than that of the transfer thyristors T, i.e., 127.

It should be noted that the number of the transfer thyristors T may be greater than that of the light-emitting thyristors L.

FIG. 5 shows a part focusing on the light-emitting thyristors L1 to L4 and the transfer thyristors T1 to T4.

The thyristor (the light-emitting thyristor L and the transfer thyristor T) is a semiconductor element including a first gate, a second gate, an anode and a cathode. The coupling transistor Q is a semiconductor element including a collector, a base and an emitter.

As will be described later, other than a case where a p-type ohmic electrode or an n-type ohmic electrode is provided on a portion of the semiconductor layer that corresponds to the first gate, the second gate, the anode, the cathode, the collector, the base or the emitter to be connected via wiring, there is a case in which the thyristor and the coupling transistor Q are connected with each other via the semiconductor layers.

Here, the thyristor (the light-emitting thyristor L and the transfer thyristor T) and the coupling transistor Q are denoted by circuit symbols, and there are some cases in which symbols are not used for the anode and the cathode of the thyristor (the light-emitting thyristor L and the transfer thyristor T), though the first gate (Glf and Gtf to be described later) and the second gate (Gts to be described later) are denoted by symbols. In a similar manner, there are some cases where symbols are not used for the emitter and the base of the coupling transistor Q, though the collector (C to be described later) is denoted by a symbol.

Next, electrical connection of the elements in the light-emitting chip U1 (U) will be described.

The anode of each of the transfer thyristor T and the light-emitting thyristor L is connected to the substrate 80 of the light-emitting chip U1 (U) (anode common). It should be noted that the emitter of the coupling transistor Q is also connected to the substrate 80 of the light-emitting chip U1 (U).

These anodes are then connected to the power supply line 200a (refer to FIG. 4B) via Vsub terminal that is a back-side electrode 85 (refer to FIG. 6B to be described later) provided on the rear surface of the substrate 80. The reference potential Vsub is supplied to the power supply line 200a from the reference potential supply portion 160.

The cathodes of odd-numbered transfer thyristors T1, T3, T5, ..., are connected to the first transfer signal line 72 along the arrangement of the transfer thyristors T. The first transfer signal line 72 is then connected to the $\phi1$ terminal via the current limitation resistance R1. The first transfer signal line 201 (refer to FIG. 4B) is connected to the $\phi1$ terminal to transmit the first transfer signal $\phi1$ from the transfer signal generating portion 120.

On the other hand, the cathodes of even-numbered transfer thyristors T2, T4, T6, ..., are connected to the second transfer signal line 73 along the arrangement of transfer thyristors T. The second transfer signal line 73 is then connected to the $\phi2$ terminal via the current limitation resistance R2. The second transfer signal line 202 (refer to FIG. 4B) is connected to the φ2 terminal to transmit the second transfer signal φ2 from the transfer signal generating portion 120.

The cathode of the light-emitting thyristor L is connected to a light-up signal line 75. The light-up signal line 75 is then connected to the φI terminal. In the light-emitting chip U1, the φI terminal is connected to the light-up signal line 204-1 via the current limitation resistance RI, and accordingly, the light-up signal φI1 is transmitted from the light-up signal generating portion 140. The light-up signal φI supplies a current for lighting to the light-emitting thyristor L. It should be noted that, to the φI terminals of the other light-emitting chips U2 to U40, the light-up signal lines 204-2 to 204-40 are connected via the current limitation resistance RI, respectively, and accordingly, the light-up signals φI2 to φI40 are transmitted from the light-up signal generating portion 140.

First gates Gtf1, Gtf2, Gtf3, . . . of the transfer thyristors T1, T2, T3, . . . are connected to the same numbered first gates Glf1, Glf2, Glf3, . . . of the light-emitting thyristors L1, L2, L3 . . . , on one-to-one basis, respectively. Accordingly, in the first gates Gtf1, Gtf2, Gtf3, . . . of the transfer thyristors T1, T2, T3, . . . and the first gates Glf1, Glf2, Glf3, . . . of the light-emitting thyristors L1, L2, L3 . . . , the same numbered first gates have the same potential. Therefore, denotation of, for example, "first gate Gtf1 (first gate Glf1)" is used to indicate that these gates have the same potential.

The coupling transistor Q1 is connected between the second gate Gts1 of the transfer thyristor T1 and the first gate Gtf2 of the transfer thyristor T2. The second gate Gts1 of the transfer thyristor T1 is connected to the base of the coupling transistor Q1, and the first gate Gtf2 of the transfer thyristor T2 is connected to the collector C1 of the coupling transistor Q1.

Between two successive transfer thyristors T, which is numbered at least as 2, the coupling transistor Q is also connected in a similar manner.

Here, the first gates Gtf1, Gtf2 Gtf3, . . . , the second gates Gts1, Gts2, Gts3, . . . , and the first gates Glf1, Glf2, Glf3, . . . , when not distinguished, are referred to as a first gate Gtf, a second gate Gts and a first gate Glf, respectively. Then, denotation of, for example, "first gate Gtf (first gate Glf)" is used to indicate that these gates have the same potential.

It should be noted that, though the light-emitting thyristor L also includes a second gate, the gate is not connected to any other elements, therefore no symbol is assigned.

The first gate Gtf of the transfer thyristor and the first gate Glf of the light-emitting thyristor are connected to a power supply line 71 via the power supply line resistances Rg provided to the transfer thyristor T respectively corresponding thereto. The power supply line 71 is connected to the Vga terminal. The Vga terminal is connected to the power supply line 200b (refer to FIG. 4B), and the power supply potential Vga is supplied from the power supply potential supply portion 170.

The first gate Gtf1 of the transfer thyristor T1 at one end of the transfer thyristor array is connected to one of terminals of the start resistance R0. On the other hand, the other terminal of the start resistance R0 is connected to the second transfer signal line 73.

In FIG. 5, a portion including the transfer thyristor T, the coupling transistor Q, the power supply line resistance Rg, the start resistance R0 and the current limitation resistances R1 and R2 is denoted as a transfer portion 101. A portion including the light-emitting thyristor L corresponds to the light-emitting portion 102.

FIGS. 6A and 6B are examples of a layout plan view and a cross-sectional view of the light-emitting chip U to which the first exemplary embodiment is applied. Here, since a connective relation between the light-emitting chip U and the signal generating circuit 110 is not shown, it is unnecessary to give a description by taking the light-emitting chip U1 as a specific example. Therefore, denotation will be the light-emitting chip U.

FIG. 6A is a layout plan view of the light-emitting chip U, and shows the part centered on the light-emitting thyristors L1 to L4 and the transfer thyristors T1 to T4. It should be noted that the terminals (the φ1 terminal, the φ2 terminal, the Vga terminal and the φI terminal), although shown at different positions from those in FIG. 4A, are shown at the left end of FIG. 6A for convenience of description. The Vsub terminal provided on the rear surface of the substrate 80 is illustrated to be drawn out of the substrate 80. When the terminals are supposed to be provided corresponding to FIG. 4A, the φ2 terminal, the φI terminal and the current limitation resistance R2 are provided at a right-end portion of the substrate 80 in FIG. 6A. It should be noted that the start resistance R0 is placed at an end portion on a side of the transfer thyristor array where transfer is started.

In FIG. 6A, wirings (the power supply line 71, the first transfer signal line 72, the second transfer signal line 73, the light-up signal line 75 and the like) are indicated by broken lines, to thereby make a structure under the wirings clear.

FIG. 6B is a cross-sectional view taken along the line VIB-VIB shown in FIG. 6A. Thus, FIG. 6B shows the cross sections of the light-emitting thyristor L1, the transfer thyristor T1, the coupling transistor Q and the power supply line resistance Rg2 in the order from the bottom to the top of FIG. 6B. In FIGS. 6A and 6B, names of elements, the first gate Gtf1 of the transfer thyristor T1, the first gate Glf1 of the light-emitting thyristor L1 and the collector C1 of the coupling transistor Q are denoted.

As shown in FIG. 6B, the light-emitting chip U includes multiple islands (a first island 301, a second island 302, a third island 303 and the like, which will be described later) configured by separating a semiconductor layer stack in which, on the p-type substrate 80, the p-type being a specific example of a first conduction type, a p-type first semiconductor layer 81, an n-type second semiconductor layer 82, the n-type being a specific example of a second conduction type, a p-type third semiconductor layer 83, and an n-type fourth semiconductor layer 84 are laminated in the order. In other words, as shown in FIG. 6B, these multiple islands are formed by separating at least the n-type second semiconductor layer 82, the p-type third semiconductor layer 83 and the n-type fourth semiconductor layer 84 from one another. It should be noted that the p-type first semiconductor layer 81 may or may not be separated. In FIG. 6B, part of the p-type first semiconductor layer 81 is removed in the thickness direction. Moreover, the p-type first semiconductor layer 81 may also serve as the substrate 80.

As will be described later, in these islands, the light-emitting thyristor L, the transfer thyristor T, the coupling transistor Q, the power supply line resistance Rg and the like are configured by removing part or all of the n-type fourth semiconductor layer 84 or the p-type third semiconductor layer 83.

As shown in FIG. 6B, an insulating layer 86 is provided to the light-emitting chip U so as to cover the surface and side surface of the islands. These islands and wirings are connected to each other via through holes (in FIG. 6A, denoted by "◯") provided in the insulating layer 86. Hereinafter, descriptions of the insulating layer 86 and the through holes will be omitted.

As shown in FIG. 6A, the first island 301 has a U-shaped plan shape, and the light-emitting thyristor L1 is provided on a center portion of the U-shape, whereas the transfer thyristor T1 and the coupling transistor Q1 are provided on one end of the U-shape (at the right side in FIG. 6A).

The second island 302 and the third island 303 have a plan shape that connects rectangles at both end portions (at the vertical sides in FIG. 6A), and the power supply line resistances Rg1 and Rg2 are provided to the second island 302 and the third island 303, respectively.

The fourth island 304, the fifth island 305 and the sixth island 306 have the plan shape similar to those of the second island 302 and the third island 303, and the start resistance R0, the current limitation resistance R1 and the current limitation resistance R2 are provided to the fourth island 304, the fifth island 305 and the sixth island 306, respectively.

In the light-emitting chip U, plural islands similar to the first island 301 and the second island 302 (the third island 303) are formed in parallel. These islands includes the light-emitting thyristors L2, L3, L4, . . . , the transfer thyristors T2, T3, T4, . . . , the coupling transistors Q2, Q3, Q4, . . . , and the power supply line resistances Rg3, Rg4, Rg5, . . . in a similar manner as the first island 301 and the second island 302 (the third island 303).

Also, as shown in FIG. 6B, the rear surface of the substrate 80 includes the back-side electrode 85 as Vsub terminal.

Here, the first island 301 to the sixth island 306 will be further described in detail with reference to FIGS. 6A and 6B.

In the first island 301 having a plan shape of the U-shape, in the light-emitting thyristor L1 provided to the center portion of the U-shape, it is assumed that the p-type first semiconductor layer 81 provided on the p-type substrate is an anode and a region 311 of the n-type fourth semiconductor layer 84, which is left after the surrounding n-type fourth semiconductor layer 84 is removed, is a cathode. An n-type ohmic electrode 321 is provided on the region 311 of the n-type fourth semiconductor layer 84. It should be noted that the p-type first semiconductor layer 81, the n-type fourth semiconductor layer 84 and the n-type ohmic electrode 321 are referred to as an anode layer, a cathode layer and a cathode, respectively, in some cases.

Further, the p-type third semiconductor layer 83 is a first gate Glf1, and a p-type ohmic electrode 331 is provided on the p-type third semiconductor layer 83, which has been exposed by removing the n-type fourth semiconductor layer 84, along the inside of the U-shape of the first island 301. At one side of the U-shape, the p-type ohmic electrode 331 extends to the proximity of the transfer thyristor T provided at the center portion of the U-shape, and at the other side of the U-shape, the p-type ohmic electrode 331 extends to the end portion of the U-shape. In some cases, the p-type third semiconductor layer 83 and the p-type ohmic electrode 331 are referred to as a first ohmic layer and a first gate Glf1, respectively.

The n-type second semiconductor layer 82 is the second gate. It should be noted that the n-type second semiconductor layer 82 is referred to as a second gate layer in some cases.

The light-emitting thyristor L emits light at an interface between the n-type second semiconductor layer 82 and the p-type third semiconductor layer 83. The light passes through the insulating layer 86 from a portion in the surface of the region 311 (the light-emitting surface) of the n-type fourth semiconductor layer 84, which is the cathode, except for a portion where the light emission is hindered (light is cut off) by the n-type ohmic electrode 321, the light-up signal line 75 and a branch portion 75b for connecting the n-type ohmic electrode 321, to be emitted.

In the first island 301, the transfer thyristor T1 is provided at the center portion on one side of the U-shape (at the right side in FIG. 6A). At the portion where the transfer thyristor T1 is provided, the p-type first semiconductor layer 81 provided on the p-type substrate 80 is an anode, and a region 312 of the n-type fourth semiconductor layer 84, which is left after the surrounding n-type fourth semiconductor layer 84 is removed, is a cathode. An n-type ohmic electrode 322 is provided on the region 312 of the n-type fourth semiconductor layer 84. It should be noted that the p-type first semiconductor layer 81, the n-type fourth semiconductor layer 84 and the n-type ohmic electrode 322 are referred to as the anode layer, the cathode layer and the cathode, respectively, in some cases.

Further, the p-type third semiconductor layer 83 is a first gate Gtf1. The p-type ohmic electrode 331 on the p-type third semiconductor layer 83 is denoted as the first gate Gtf1 in some cases. In other words, the first gate Glf1 of the light-emitting thyristor L1 and the first gate Gtf1 of the transfer thyristor T1 are the p-type ohmic electrode 331 and also the first gate Gtf1 (the first gate Glf1).

The n-type second semiconductor layer 82 is a second gate Gts1. It should be noted that the n-type second semiconductor layer 82 is sometimes referred to as a second gate layer.

In the first island 301 having the plan shape of U-shape, the coupling transistor Q1 is provided at an end portion on one side of the U-shape (at the right side in FIG. 6A). At the portion where the coupling transistor Q1 is provided, the n-type fourth semiconductor layer 84 has been removed. The p-type first semiconductor layer 81 is an emitter, the n-type second semiconductor layer 82 is a base, and the p-type third semiconductor layer 83 exposed by removing the n-type fourth semiconductor layer 84 is a collector C1. The p-type ohmic electrode 332 is provided on the p-type third semiconductor layer 83 exposed by removing the n-type fourth semiconductor layer 84. It should be noted that, in some cases, the p-type first semiconductor layer 81, the n-type second semiconductor layer 82, the p-type third semiconductor layer 83 and the p-type ohmic electrode 332 are referred to as an emitter layer, a base layer, a collector layer and a collector C1, respectively.

The p-type first semiconductor layer 81 of a portion in the light-emitting thyristor L1 that operates as the anode, the p-type first semiconductor layer 81 of a portion in the transfer thyristor T1 that operates as the anode, and the p-type first semiconductor layer 81 of a portion in the coupling transistor Q1 that operates as the emitter are successively placed.

In addition, the n-type second semiconductor layer 82 of a portion in the light-emitting thyristor L1 that operates as the second gate, the n-type second semiconductor layer 82 of a portion in the transfer thyristor T1 that operates as the second gate, and the n-type second semiconductor layer 82 of a portion in the coupling transistor Q1 that operates as the base are successively placed.

The p-type third semiconductor layer 83 of a portion in the light-emitting thyristor L1 that operates as the first gate Glf1 and the p-type third semiconductor layer 83 of a portion in the transfer thyristor T1 that operates as the first gate Gtf1 are successively placed.

Further, in FIG. 6B, the p-type third semiconductor layer 83 is illustrated so that part thereof is continued between the transfer thyristor T1 and the coupling transistor Q1. This structure will be described later.

In the second island 302 provided with the power supply line resistance Rg1, the n-type fourth semiconductor layer 84 has been removed. Then, on the exposed p-type third semiconductor layer 83, a p-type ohmic electrode 333 and a p-type ohmic electrode 334 are provided. The p-type third semiconductor layer 83 between the p-type ohmic electrode 333 and the p-type ohmic electrode 334 on the p-type third semiconductor layer 83 is provided to form the power supply line resistance Rg1. The third island 303 provided with the power supply line resistance Rg2 is similar to the second island 302. That is, the p-type third semiconductor layer 83 between a p-type ohmic electrode 335 and a p-type ohmic electrode 336 provided on the exposed p-type third semiconductor layer 83 forms the power supply line resistance Rg2.

Similar to the power supply line resistance Rg1 provided to the second island 302, each of the start resistance R0 provided to the fourth island 304, the current limitation resistance R1 provided to the fifth island 305 and the current limitation resistance R2 provided to the sixth island 306 has a resistance configured with the p-type third semiconductor layer 83 between two p-type ohmic electrodes (having no reference numeral).

Connection relationship between the elements in FIG. 6A will be described.

The light-up signal line 75 includes a trunk portion 75a and plural branch portions 75b, and the trunk portion 75a is provided to extend in the direction of the light-emitting thyristor array. The branch portions 75b are branched from the trunk portion 75a and connected to the n-type ohmic electrode 321 (the cathode) on the region 311 in the n-type fourth semiconductor layer 84 of the light-emitting thyristor L1 provided in the first island 301. In a similar manner, the cathodes of the other light-emitting thyristors L provided in the islands similar to the first islands 301 are also connected to the light-up signal line 75. The light-up signal line 75 is connected to the φI terminal.

The first transfer signal line 72 is connected to the n-type ohmic electrode 322 (the cathode) on the region 312 in the n-type fourth semiconductor layer 84 of the transfer thyristor T1 provided in the first island 301. The cathodes of the other odd-numbered transfer thyristors T provided in the islands similar to the first islands 301 are also connected to the first transfer signal line 72. The first transfer signal line 72 is connected to the φ1 terminal via the current limitation resistance R1 provided in the fifth island 305.

On the other hand, the second transfer signal line 73 is connected to the cathodes of the even-numbered transfer thyristors T provided in the islands to which reference numerals are not assigned. The second transfer signal line 73 is connected to the φ2 terminal via the current limitation resistance R2 provided in the sixth island 306.

The power supply line 71 is connected to the p-type ohmic electrode 334 of the power supply line resistance Rg1 provided to the second island 302 and the p-type ohmic electrode 336 of the power supply line resistance Rg2 provided to the third island 303. In a similar manner, other power supply line resistances Rg provided to the islands similar to the second island 302 (the third island 303) are also connected to the power supply line 71. The power supply line 71 is connected to the Vga terminal.

Then, the p-type ohmic electrode 331 (the first gate Gtf1 (the first gate Glf1)) provided along the inside of the U-shape of the first island 301, which has the plan shape of the U-shape, extends to an end portion of the other side of the U-shape, and is connected to the p-type ohmic electrode 333 of the power supply line resistance Rg1 provided to the second island 302 via a connection wiring 76.

The p-type ohmic electrode 332 (the collector C1 of the coupling transistor Q1) provided at the end portion on one side of the U-shape of the first island 301 having the plan shape of the U-shape is connected to the p-type ohmic electrode 335 of the power supply line resistance Rg2 provided to the third island 303 via a connection wiring 77.

Other light-emitting thyristors L, transfer thyristors T, coupling transistors Q and power supply line resistances Rg have similar connection relationship, though descriptions thereof will be omitted here.

The p-type ohmic electrode 331 (the first gate Gtf1 (the first gate Glf1)) in the first island 301 and the p-type ohmic electrode 333 (one of terminals of the power supply line resistance Rg1) in the second island 302 are connected to one of p-type ohmic electrodes (having no reference numeral) of the start resistance R0 provided to the fourth island 304 via the above-described connection wiring 76. The other terminal of the start resistance R0 is connected to the second transfer signal line 73.

In this way, the light-emitting chip U1 (U) shown in FIG. 5 is configured.

(Transfer Thyristor T and Coupling Transistor Q)

Here, the transfer thyristor T and the coupling transistor Q will be described.

Figure 7B:
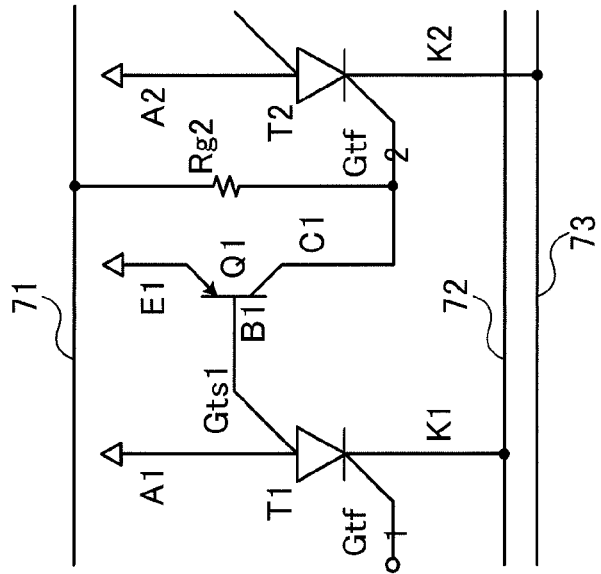
FIGS. 7A to 7C are diagrams for illustrating transfer thyristors and coupling transistors.
Figure 7A:
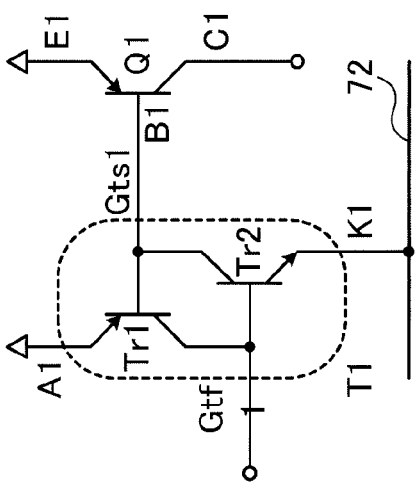
Figure 7C:
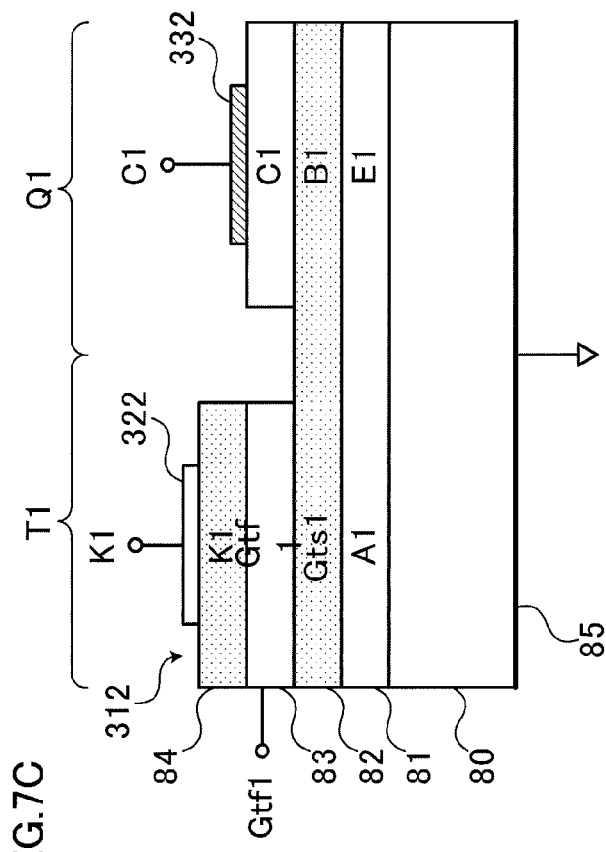

FIG. 7A to 7C are diagrams for illustrating the transfer thyristor T1 and the coupling transistor Q1. FIG. 7A is a diagram that denotes the transfer thyristor T1 and the coupling transistor Q1 by symbols of equivalent transistors. FIG. 7B denotes the transfer thyristor T1 by symbols of thyristors and adds the adjacent transfer thyristor T2. FIG. 7C is a cross-sectional view of the transfer thyristor T1 and the coupling transistor Q1. FIG. 7C is also a diagram that enlarges a portion of the transfer thyristor T1 and the coupling transistor Q1 in the cross-sectional view in FIG. 6B.

In FIGS. 7A to 7C, for ease in description, the anode and the cathode of the transfer thyristor T1 are denoted as A1 and K1, respectively, the anode and the cathode of the transfer thyristor T2 are denoted as A2 and K2, respectively, and the emitter, the base and the collector in the coupling transistor Q1 are denoted as E1, B1 and C1, respectively.

As shown in FIG. 7A, the transfer thyristor T1 has a configuration that combines a pnp-transistor Tr1 and an npn-transistor Tr2. Specifically, a base of the pnp-transistor Tr1 is connected to a collector of the npn-transistor Tr2, and a collector of the pnp-transistor Tr1 is connected to a base of the npn-transistor Tr2. An emitter of the pnp-transistor Tr1 is the anode A1 of the transfer thyristor T1, the collector of the pnp-transistor Tr1 (the base of the npn-transistor Tr2) is the first gate Gtf1 of the transfer thyristor T1, the collector of the npn-transistor Tr2 (the base of the pnp-transistor Tr1) is the second gate Gts1 of the transfer thyristor T1, and an emitter of the npn-transistor Tr2 is the cathode K1 of the transfer thyristor T1. The emitter of the pnp-transistor Tr1, which is the anode A1 of the transfer thyristor T1, is connected to the substrate 80 having the reference potential Vsub.

The coupling transistor Q1 is a pnp-transistor, and the base B1 thereof is connected to the npn-transistor Tr2, which is the second gate Gts1 of the transfer thyristor T1, and the base of the pnp-transistor Tr1. The emitter of the coupling transistor Q1 is connected to the substrate 80 having the reference potential Vsub.

As shown in FIG. 7A, the pnp-transistor Tr1 of the transfer thyristor T1 and the coupling transistor Q1 constitute a current mirror circuit. In other words, a current in proportion to a current passing through the pnp-transistor Tr1 passes through the coupling transistor Q1.

Hereinafter, as a specific example, the reference potential Vsub that is supplied to the back-side electrode 85, which is the Vsub terminal (refer to FIGS. 5 and 6B), will be described as a high-level potential of 0V (hereinafter, referred to as "H" (0V)), and the power supply potential Vga that is supplied to the Vga terminal will be described as a low-level potential of −3.3V (hereinafter, referred to as "L" (−3.3V)).

In the first exemplary embodiment, the light-emitting device 65 (refer to FIG. 3) is driven at a negative potential.

As shown in FIG. 6B, the thyristors (the transfer thyristor T and the light-emitting thyristor L) and the coupling transistors Q are configured by laminating the p-type semiconductor layers (the p-type first semiconductor layer 81 and the p-type third semiconductor layer 83) and the n-type semiconductor layers (the n-type second semiconductor layer 82 and the n-type fourth semiconductor layer 84) on the p-type substrate 80. These layers are supposed to be composed of GaAs, GaAlAs or the like, and a forward direction potential (a diffusion potential) Vd of pn junction configured with the p-type semiconductor layers and the n-type semiconductor layers is assumed to be 1.5V as a specific example.

First, basic operations of the thyristors (the transfer thyristors T and the light-emitting thyristors L) will be described by the transfer thyristor T1.

The p-type first semiconductor layer 81, which is the anode A1 of the transfer thyristor T1, is provided on the p-type substrate 80, and has the reference potential Vsub ("H" (0V)) supplied to the back-side electrode 85 of the p-type substrate 80.

In the transfer thyristor in an OFF state, there is a state between the anode A1 and the cathode K1 in which a small current flows compared to an ON state. At this time, the pnp-transistor Tr1 and the npn-transistor Tr2 constituting the transfer thyristor T1 are in the OFF state.

Here, it is assumed that the first transfer signal line 72 connected to the cathode K1 of the transfer thyristor T1 has a potential "L" (−3.3V).

At this time, if the first gate Gtf1 is at the potential that adds the diffusion potential Vd (1.5V) to "L" (−3.3V), namely, here, the potential higher than −1.8V (the positive side is referred to as "high", and the negative side is referred to as "low"), there is generated a forward bias between the emitter and the base of the npn-transistor Tr2, to be brought into the ON state from the OFF state. Then, since the collector of the npn-transistor Tr2 is drawn to the "L" (−3.3V) side, a forward bias is generated between the emitter ("H" (0V)) and the base of the pnp-transistor Tr1, and thereby the pnp-transistor Tr1 is also brought into the ON state from the OFF state. In other words, both of the pnp-transistor Tr1 and the npn-transistor Tr2 come to the ON state, and accordingly, the transfer thyristor T1 is brought into the ON state from the OFF state. The shift of the transfer thyristor T1 from the OFF state to the ON state is referred to as turning on.

In the transfer thyristor T1 in the ON state, the first gate Gtf1 has a potential closer to the potential of the anode A1 (namely, a negative potential whose absolute value is larger than the potential of the anode A1). Here, since the anode A1 is set at the reference potential Vsub ("H" (0V)), the potential of the first gate Gtf1 is assumed to be "H" (0V). The second gate Gts1 has a potential (−1.5V), which is a result of subtracting the forward direction potential Vd (1.5V) of the pn junction from the potential of the anode A1.

The cathode K1 of the transfer thyristor T1 in the ON state has a potential closer to a potential obtained by subtracting the diffusion potential Vd (1.5V) from the potential of the anode A1 ("H" (0V)) (a negative potential whose absolute value is larger than 1.5V). It should be noted that the potential of the cathode K1 is set according to current supply capacity of a power supply that supplies a current to the thyristor in the ON state.

As described above, by providing a forward bias between the emitter (the cathode K1) and the base (the first gate Gtf1) of the npn-transistor Tr2 that constitutes the transfer thyristor T1, the transfer thyristor T1 is turned on. To provide the forward bias between the emitter (the cathode K1) and the base (the first gate Gtf1) of the npn-transistor Tr2, the potential of the cathode K1 may be set lower than a potential obtained by subtracting the diffusion potential Vd (1.5V) from the potential of the first gate Gtf1. The potential obtained by subtracting the diffusion potential Vd from the potential of the first gate Gtf1 is referred to as a threshold voltage of the transfer thyristor T1. Accordingly, the threshold voltage of the transfer thyristor T1 is determined by the potential of the first gate Gtf1, and the transfer thyristor T1 is turned on when the cathode K1 (the first transfer signal line 72) comes to have a potential lower than the threshold voltage.

The transfer thyristor T1 that has turned on maintains the ON state if a potential lower than a potential obtained by subtracting the diffusion potential Vd (1.5V) from the potential of the anode A1 ("H" (0V)) (a maintenance voltage) is applied to the cathode K1, and thereby a current capable of maintaining the ON state (a maintenance current) is continuously supplied from a power supply.

On the other hand, when a potential higher than a potential obtained by subtracting the diffusion potential Vd (1.5V) from the potential of the anode A1 ("H" (0V)) is applied to the cathode K1, the transfer thyristor T1 in the ON state shifts from the ON state to the OFF state. The shift of the transfer thyristor T1 from the ON state to the OFF state is referred to as turning off. For example, if the cathode K1 comes to a potential "H" (0V), since the potential is higher than the maintenance voltage required to maintain the ON state (a potential lower than −1.5V) as well as the potential of the cathode K1 and the potential of the anode A1 become equal, the transfer thyristor T1 is turned off.

Next, a description will be given of operations of the coupling transistor Q1.

When the transfer thyristor T1 is in the OFF state, the coupling transistor Q1 is also in the OFF state.

As mentioned above, when the transfer thyristor T1 is turned on, the forward bias is generated between the emitter (the anode A1) and the base (the second gate Gts1) of the pnp-transistor Tr1. Then, since the second gate Gts1 is connected to the base B1 of the coupling transistor Q1, the forward bias is also provided between the emitter E1 and the base B1 of the coupling transistor Q1, and accordingly, the coupling transistor Q1 is shifted from the OFF state to the ON state.

It should be noted that, if the potential between the emitter E1 and the base B1 of the coupling transistor Q1 becomes higher than a potential obtained by subtracting the diffusion potential Vd (1.5V) from the potential of the emitter E1 ("H" (0V)), the coupling transistor Q1 is shifted from the ON state to the OFF state.

In the foregoing, descriptions have been given of the transfer thyristor T1 and the coupling transistor Q1; however, other transfer thyristors T and coupling transistors Q operate in a similar manner. The light-emitting thyristors L also operate similar to the transfer thyristor T1.

Further description will be given with reference to FIG. 7B.

As described above, when the transfer thyristor T1 is turned on, the coupling transistor Q1 is shifted from the OFF state to the ON state. The collector C1 of the coupling transistor Q1 is connected to the first gate Gtf2 of the transfer thyristor T2, as well as being connected to the power supply line 71 of the power supply potential Vga ("L" (−3.3V)) via the power supply line resistance Rg2. Accordingly, the potential of the collector C1 of the coupling transistor Q1 (the first gate Gtf2 of the transfer thyristor T2) is determined by a current passing through the coupling transistor Q1 and the power supply line resistance Rg2 and resistance of each of the coupling transistor Q1 and the power supply line resistance Rg2.

Here, a description will be given on the assumption that the potential of the collector C1 of the coupling transistor Q1 (the first gate Gtf2 of the transfer thyristor T2) becomes −1V as a specific example.

Then, the threshold voltage of the transfer thyristor T2 becomes a potential (−2.5V) obtained by subtracting the diffusion potential Vd (1.5V) from the potential of the first gate Gtf2 (−1V). Accordingly, when the potential of the second transfer signal line 73 becomes lower than the potential (−2.5V), the transfer thyristor T2 is turned on.

As shown in FIG. 7C, the p-type first semiconductor layer 81 is the anode A1 in the portion where the transfer thyristor T1 is configured, whereas the p-type first semiconductor layer 81 is the emitter E1 in the portion where the coupling transistor Q1 is configured. The n-type second semiconductor layer 82 is the second gate Gts1 in the portion where the transfer thyristor T1 is configured, whereas the n-type second semiconductor layer 82 is the base B1 in the portion where the coupling transistor Q1 is configured. The p-type third semiconductor layer 83 is the first gate Gtf1 in the portion where the transfer thyristor T1 is configured, whereas the p-type third semiconductor layer 83 is the collector C1 in the portion where the coupling transistor Q1 is configured. The n-type fourth semiconductor layer 84 is the cathode K1 in the portion where the transfer thyristor T1 is configured; however, the n-type fourth semiconductor layer 84 is removed in the portion where the coupling transistor Q1 is configured.

As shown in FIG. 7A, since both of the anode A1 of the transfer thyristor T1 and the emitter E1 of the coupling transistor Q1 have the reference potential Vsub ("H" (0V)), the p-type first semiconductor layer 81 thereof may be continued.

Moreover, as shown in FIG. 7A, the second gate Gts1 of the transfer thyristor T1 and the base B1 of the coupling transistor Q1 are connected to each other. Accordingly, the n-type second semiconductor layer 82 is required to be continued between the portion where the transfer thyristor T1 is configured and the portion where the coupling transistor Q1 is configured.

Further, as shown in FIG. 7A, the first gate Gtf1 of the transfer thyristor T1 and the collector C1 of the coupling transistor Q1 are not connected to each other. Accordingly, the p-type third semiconductor layer 83 is required to be separated between the portion where the transfer thyristor T1 is configured and the portion where the coupling transistor Q1 is configured.

Consequently, the p-type third semiconductor layer 83 is required to be separated between the portion where the transfer thyristor T1 is configured and the portion where the coupling transistor Q1 is configured. It should be noted that the portion where the transfer thyristor T1 is configured and the portion where the coupling transistor Q1 is configured may be separated electrically in the p-type third semiconductor layer 83.

FIG. 7C shows a state in which the p-type third semiconductor layer 83 is removed between the portion where the transfer thyristor T1 is configured and the portion where the coupling transistor Q1 is configured. It should be noted that FIG. 6B shows a state in which part of the p-type third semiconductor layer 83 is left between the portion where the transfer thyristor T1 is configured and the portion where the coupling transistor Q1 is configured. These will be described later.

(Operations of Light-Emitting Device 65)

Next, operations of the light-emitting device 65 will be described.

As mentioned above, the description will be given on the assumption that the reference potential Vsub is "H" (0V) and the power supply potential Vga is "L" (−3.3V). Moreover, it is assumed that the first transfer signal ϕ1, the second transfer signal ϕ2 and the light-up signal ϕI have two potentials, namely, "H" (0V) and "L" (−3.3V). It should be noted that "H" (0V) and "L" (−3.3V) are abbreviated as "H" and "L", respectively, in some cases.

As described above, the light-emitting device 65 includes the light-emitting chips U1 to U40 (refer to FIGS. 3 and 4B).

As shown in FIG. 4B, the reference potential Vsub ("H" (0V)) and the power supply potential Vga ("L" (−3.3V)) are supplied to all the light-emitting chips U1 to U40 on the circuit board 62 in common. In a similar manner, the first transfer signal ϕ1 and the second transfer signal ϕ2 are transmitted to all the light-emitting chips U1 to U40 in common (in parallel).

On the other hand, the light-up signals ϕI1 to ϕI40 are separately transmitted to the light-emitting chips U1 to U40, respectively. The light-up signals ϕI1 to ϕI40 set light up or light off of the light-emitting thyristors L of the respective light-emitting chips U1 to U40 based on image data. Consequently, the light-up signals ϕI1 to ϕI40 have different waveform from one another in accordance with the image data. However, the light-up signals ϕI1 to ϕI40 are transmitted in parallel at the same timing.

Since the light-emitting chips U1 to U40 are driven in parallel, description of operations of the light-emitting chip U1 will be sufficient to cover the other light-emitting chips U2 to U40.

<Timing Chart>

Figure 8:
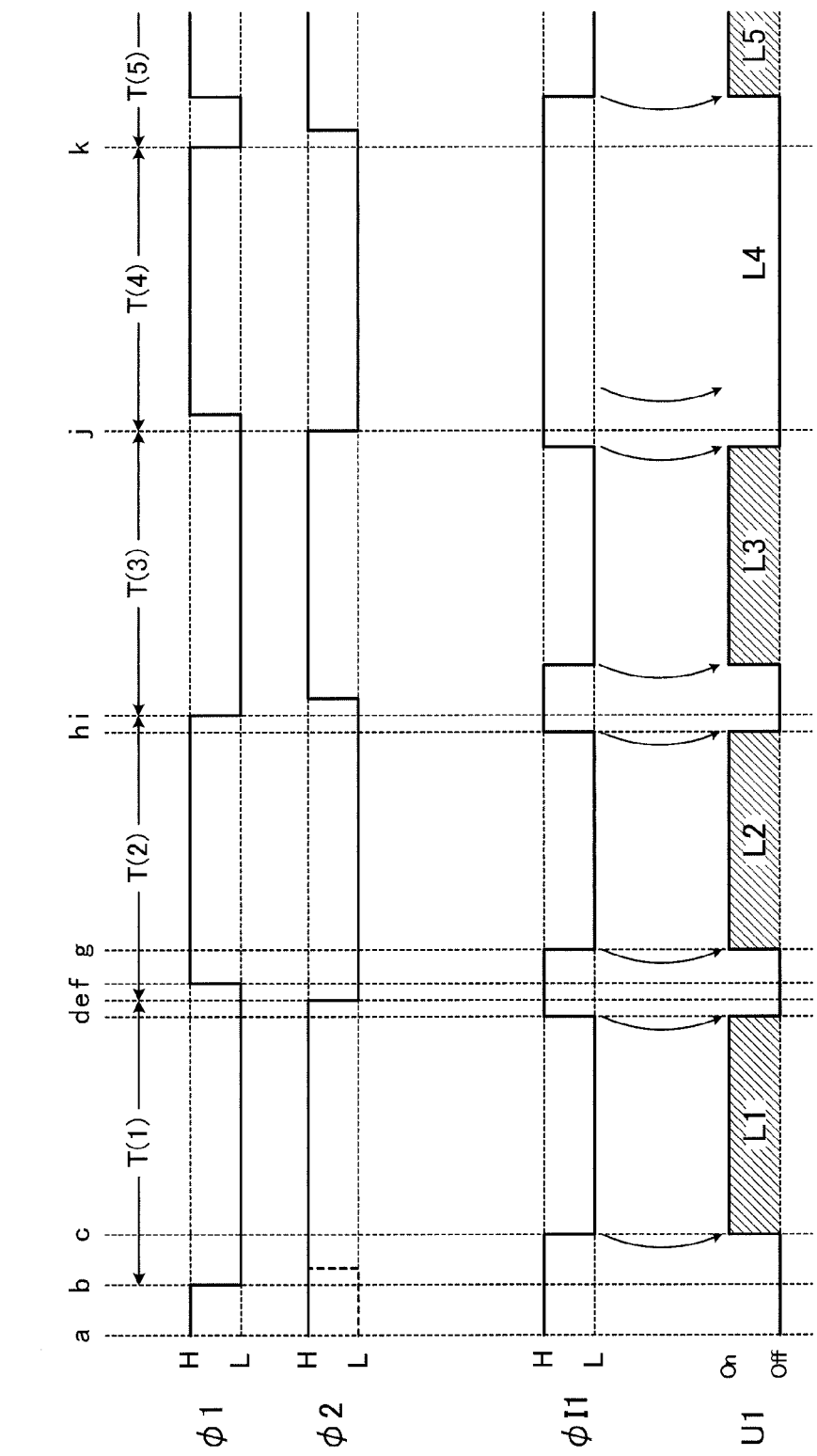
FIG. 8 is a timing chart for illustrating operations of the light-emitting device and the light-emitting chip.

FIG. 8 is a timing chart for illustrating operations of the light-emitting device 65 and the light-emitting chips U.

FIG. 8 shows the timing chart of a portion to control whether or not to light up (referred to as lighting control) the five light-emitting thyristors, namely L1 to L5, in the light-emitting chip U1. It should be noted that, in FIG. 8, the light-emitting thyristors L1, L2, L3 and L5 in the light-emitting chip U1 are lighted up, whereas the light-emitting thyristor L4 is lighted off (not lighted up).

As mentioned above, since the other light-emitting chips U2 to U40 are driven in parallel with the light-emitting chip U1, description of operations of the light-emitting chip U1 will be sufficient to cover the light-emitting chips U2 to U40.

In FIG. 8, it is assumed that time elapses in alphabetical order from a time point a to a time point k. The control whether or not to light up (lighting control) is performed on the light-emitting thyristor L1 during a time period T(1) from a time point b to a time point e, performed on the light-emitting thyristor L2 during a time period T(2) from a time point e to a time point i, performed on the light-emitting thyristor L3 during a time period T(3) from a time point i to a time point j, and performed on the light-emitting thyristor L4 during a time period T(4) from a time point j to a time point k. In a similar manner, lighting control of the light-emitting thyristors having a number of 5 or more is performed.

Here, time periods T(1), T(2), T(3), . . . , have the same length, and, when not distinguished, are referred to as time period T.

It should be noted that the length of time periods T(1), T(2), T(3), . . . may be variable as long as mutual relationship between signals described below is maintained.

Waveforms of the first transfer signal ϕ1, the second transfer signal ϕ2 and the light-up signal ϕI will be described. It should be noted that, in the time period from the time point a to the time point b, the light-emitting chip U1 starts operations (the same is true for the light-emitting chips U2 to U40). A description of the signals in this time period will be given in the description of operations.

In the first transfer signal φ1 transmitted to the φ1 terminal (refer to FIGS. 5 and 6A) and the second transfer signal φ2 transmitted to the φ2 terminal (refer to FIGS. 5 and 6A), waveforms are repeated with two consecutive time periods Ts (for example, the time period T(1) and the time period T(2)).

The first transfer signal φ1 shifts from "H" to "L" at the start time point b of the time period T(1) and shifts from "L" to "H" at the time point f. Then, at the end time point i of the time period T(2), the first transfer signal φ1 shifts from "H" to "L".

The second transfer signal φ2 is at "H" at the start time point b of the time period T(1), and shifts from "H" to "L" at the time point e. Then, the second transfer signal φ2 maintains "L" at the end time point i of the time period T(2).

As the second transfer signal φ2 is compared to the first transfer signal φ1, the second transfer signal φ2 corresponds to the first transfer signal φ1 shifted to a point delayed by the time period T on the time axis. In the first transfer signal φ1, a waveform in the time periods T(1) and T(2) is repeated in the time period T(3) and the time periods subsequent thereto. On the other hand, in the second transfer signal φ2, a waveform indicated by a broken line in the time period T(1) and a waveform in the time period T(2) are repeated in the time period T(3) and the time periods subsequent thereto. The reason why the waveform of the second transfer signal φ2 in the time period T(1) is different from those in the time period T(3) and the time periods subsequent thereto is that the time period T(1) is a time period in which the light-emitting device 65 starts operations thereof.

A pair of transfer signals of the first transfer signal φ1 and the second transfer signal φ2 designates the transfer thyristors T in the ON state and the same-numbered light-emitting thyristors L as a target of control whether or not to light up (referred to as lighting control) by transferring (propagating) the ON state through the transfer thyristors T shown in FIGS. 5 and 6A in the numerical order, as will be described later.

Next, the light-up signal φI1 transmitted to the φI terminal of the light-emitting chip U1 will be described. It should be noted that the light-up signals φI2 to φI40 are transmitted to the other light-emitting chips U2 to U40, respectively.

Here, a description will be given of the light-up signal φI1 in the time period T(1) of the lighting control for the light-emitting thyristor L1 in the light-emitting chip U1.

In the case of lighting the light-emitting thyristor L1, the light-up signal φI1 is at "H" at the start time point b of the time period T(1) and shifts from "H" to "L" at the time point c. Then, the light-up signal φI1 shifts from "L" to "H", and maintains "H" at the end time point e of the time period T(1).

The operations of the light-emitting device 65 and the light-emitting chip U1 are described according to the timing chart shown in FIG. 8 with reference to FIGS. 4A, 4B and 5. It should be noted that, hereinafter, description will be given of the time periods T(1) and T(2) in which the light-emitting thyristors L1 and L2 are subjected to the lighting control.

(1) Time Point a
<Light-Emitting Device 65>
At the time point a, the reference potential supply portion 160 of the signal generating circuit 110 in the light-emitting device 65 sets the reference potential Vsub ("H" (0V)). The power supply potential supply portion 170 sets the power supply potential Vga ("L" (−3.3V)). Then, the power supply line 200a on the circuit board 62 of the light-emitting device 65 is at the reference potential Vsub ("H" (0V)) and the Vsub terminal of each of the light-emitting chips U1 to U40 is at "H". Similarly, the power supply line 200b is at the power supply potential Vga ("L" (−3.3V)) and the Vga terminal of each of the light-emitting chips U1 to U40 is at "L" (refer to FIG. 4B). Accordingly, the power supply line 71 of each of the light-emitting chips U1 to U40 is at "L" (refer to FIG. 5).

The transfer signal generating portion 120 of the signal generating circuit 110 sets each of the first transfer signal φ1 and the second transfer signal φ2 at "H". Then, the first transfer signal line 201 and the second transfer signal line 202 are set at "H" (refer to FIG. 4B). Accordingly, the φ1 terminal and the φ2 terminal of each of the light-emitting chips U1 to U40 are set at "H". The potential of the first transfer signal line 72 connected to the φ1 terminal via the current limitation resistance R1 is also at "H", and the potential of the second transfer signal line 73 connected to the φ2 terminal via the current limitation resistance R2 is also at "H" (refer to FIG. 5).

Further, the light-up signal generating portion 140 of the signal generating circuit 110 sets each of the light-up signals φI1 to φI40 at "H". Then, the light-up signal lines 204-1 to 204-40 are also at "H" (refer to FIG. 4B). Accordingly, the φI terminal of each of the light-emitting chips U1 to U40 is at "H" via the current limitation resistance R1, and the light-up signal line 75 connected to the φI terminal is also at "H" (refer to FIG. 5).

It should be noted that, although the potential is assumed to change in a step-like manner in FIG. 8 and the following description, the potential actually changes gradually. Thus, even while the potential is still changing, as long as the below-mentioned conditions are satisfied, the thyristor is possibly turned on or turned off and the coupling transistor Q is variable between the ON state and the OFF state.

Next, operations of the light-emitting chip U1 will be described.
<Light-Emitting Chip U1>
The anodes of the transfer thyristor T and the light-emitting thyristor L are connected to the Vsub terminal, and accordingly, the potential thereof is set at "H" (0V).

The cathode of each of the odd-numbered transfer thyristors T1, T3, T5, . . . is connected to the first transfer signal line 72, and the potential thereof is set at "H". The cathode of each of the even-numbered transfer thyristors T2, T4, T6, . . . is connected to the second transfer signal line 73, and the potential thereof is set at "H". Accordingly, the transfer thyristor T is in the OFF state because both of the anode and the cathode are set at "H".

The cathode of the light-emitting thyristor L is connected to the light-up signal line 75 of "H". Accordingly, the light-emitting thyristor L is also in the OFF state because both of the anode and the cathode are set at "H".

As described above, the first gate Gtf1 on one end of the transfer thyristor array in FIG. 5 is connected to one of the terminals of the start resistance R0. The first gate Gtf1 is also connected to the power supply line 71 of "L" (−3.3V) via the power supply line resistance Rg1. The other terminal of the start resistance R0 is connected to the second transfer signal line 73 of "H" (0V) via the current limitation resistance R2. Accordingly, the first gate Gtf1 is at a potential obtained by dividing the potential difference between "L" (−3.3V) of the power supply line 71 and "H" (0V) of the second transfer signal line 73 by the power supply line resistance Rg1 and the start resistance R0. It should be noted that, since the second transfer signal line 73 is connected to the φ2 terminal of "H" (0V) via the current limitation resistance R2, the first gate Gtf1 may be at the potential obtained by dividing the potential difference between "L" (−3.3V) of the power supply line 71 and "H" (0V) of the φ2 terminal by the power supply line resistance Rg1, the start resistance R0 and the current limitation resistance R2. Here, it is assumed that the start resistance R0 and the current limitation resistance R2 are smaller than the power supply line resistance Rg1, and the first gate Gtf1 is at −1V as a specific example. Then, the threshold voltage of the transfer thyristor T1 is at −2.5V.

It should be noted that the potential of the first gate Gtf1 can be set in accordance with the power supply line resistance Rg1, the start resistance R0 and the current limitation resistance R2.

Since the first gate Glf1 of the light-emitting thyristor L1 is connected to the first gate Gtf1 of the transfer thyristor T1, the threshold voltage of the light-emitting thyristor L1 is also at −2.5V.

At this time, since both of the anode (the p-type first semiconductor layer 81) and the cathode (the n-type fourth semiconductor layer 84) are at "H" (0V) and the transfer thyristor T1 is in the OFF state, even though the potential of the first gate Gtf1 (the p-type third semiconductor layer 83) becomes −1V, the potential of the second gate Gts1 (the n-type second semiconductor layer 82) is not lower than a potential obtained by subtracting the diffusion potential Vd (1.5V) from "H" (0V), namely, −1.5V. Consequently, the coupling transistor Q1 is incapable of changing to the ON state, and is in the OFF state. Accordingly, the first gate Gtf2 of the transfer thyristor T2 is at "L" (−3.3V) of the power supply line 71 via the power supply line resistance Rg2. That is, the threshold voltage of the transfer thyristor T2 is −4.8V. Similarly, the threshold voltage of the other transfer thyristors T3, T4, T5, . . . is also −4.8V.

The first gates Glf2, Glf3, Glf4, . . . of the light-emitting thyristors L2, L3, L4, . . . are connected to the first gates Gtf2, Gtf3, Gtf4, . . . of the transfer thyristors T2, T3, T4, . . . , respectively, and therefore, the threshold voltage thereof is −4.8V.

(2) Time Point b

At the time point b shown in FIG. 8, the first transfer signal φ1 shifts from "H" to "L". This makes the light-emitting device 65 start operations.

When the first transfer signal φ1 shifts from "H" to "L", the potential of the first transfer signal line 72 shifts from "H" to "L" (−3.3V) via the φ1 terminal and the current limitation resistance R1. Then, the potential of the cathode of the transfer thyristor T1, whose threshold voltage is −2.5V, is at "L" (−3.3V), and thereby the transfer thyristor T1 is turned on. However, the odd-numbered transfer thyristors T having the number of 3 or more, the cathodes of which are connected to the first transfer signal line 72, are incapable of turning on because the threshold voltage thereof is −4.8V. On the other hand, the even-numbered transfer thyristors T are also incapable of turning on because the second transfer signal φ2 is at "H" (0V) and the second transfer signal line 73 is also at "H" (0V).

When the transfer thyristor T1 is turned on, the potential of the first transfer signal line 72 becomes −1.5 V, which is obtained by subtracting the diffusion potential Vd (1.5 V) from the reference potential of the Vsub ("H" (0V)) of the anode. The potential of the first gate Gtf1 becomes "H" (0V) of the reference potential of the Vsub ("H" (0V)) of the anode. The potential of the first gate Glf1 of the light-emitting thyristor L1 connected to the first gate Gtf1 of the transfer thyristor T1 also becomes "H" (0V). The threshold voltage of the light-emitting thyristor L1 becomes −1.5V.

On the other hand, when the transfer thyristor T1 is turned on, the coupling transistor Q1 shifts from the OFF state to the ON state. Then the potential of the collector C1 of the coupling transistor Q1 (the first gate Gtf2 of the transfer thyristor T2) shifts to −1V. Consequently, the threshold voltage of the transfer thyristor T2 and the light-emitting thyristor L2 becomes −2.5V.

However, since the potential of the second transfer signal line 73 is "H" (0V), the light-emitting thyristor T2 is not turned on.

It should be noted that, since the transfer thyristor T2 is in the OFF state, the coupling transistor Q2 is in the OFF state and the first gate Gtf3 of the transfer thyristor T3 is at "L" (−3.3V). Accordingly, the threshold voltage of the transfer thyristor T3 and the light-emitting thyristor L3 is −4.8V. In a similar manner, the threshold voltage of the transfer thyristors T and the light-emitting thyristors L having the number of 4 or more is also −4.8V.

Immediately after the time point b (refers to a steady state after some changes in the thyristor are caused by changes in a potential of a signal at the time point b here), the transfer thyristor T1 and the coupling transistor Q1 are in the ON state, and the other transfer thyristors T and coupling transistors Q and all the light-emitting thyristors L are in the OFF state.

It should be noted that, hereinafter, the transfer thyristors T, the coupling transistors Q and the light-emitting thyristors L in the ON state will be mentioned, whereas the transfer thyristors T, the coupling transistors Q and the light-emitting thyristors L in the OFF state will not be mentioned.

(3) Time Point c

At the time point c, the light-up signal φI1 shifts from "H" to "L".

When the light-up signal φI1 shifts from "H" to "L", the light-up signal line 75 shifts from "H" (0V) to "L" (−3.3V) via the current limitation resistance R1 and the φI terminal. Then, the light-emitting thyristor L1 having a threshold voltage of −1.5V is turned on, to be thereby lighted (emit light). This causes the potential of the light-up signal line 75 to close to −1.5V (a negative potential whose absolute value is larger than 1.5V). It should be noted that, although the light-emitting thyristor L2 has a threshold voltage of −2.5V, the light-emitting thyristor L2 is not turned on because the light-emitting thyristor L1, which has a high threshold voltage of −1.5V, is turned on to cause the potential of the light-up signal line 75 to close to −1.5V (a negative potential whose absolute value is larger than 1.5V).

Immediately after the time point c, the transfer thyristor T1 and the coupling transistor Q1 are in the ON state, and the light-emitting thyristor L1 is also in the ON state and is lighted (emits light).

(4) Time Point d

At the time point d, the light-up signal φI1 shifts from "L" to "H".

When the light-up signal φI1 shifts from "L" to "H", the light-up signal line 75 shifts from "L" to "H" via the current limitation resistance R1 and the φI terminal. Then, since both of the anode and the cathode become "H", the light-emitting thyristor L1 is turned off to be lighted off (not lighted). The lighting time period of the light-emitting thyristor L1 is from the time point c, at which the light-up signal φI1 shifts from "H" to "L", to the time point d, at which the light-up signal φI1 shifts from "L" to "H", namely, a time period in which the light-up signal φI1 is at "L".

Immediately after the time point d, the transfer thyristor T1 and the coupling transistor Q1 are in the ON state.

(5) Time Point e

At the time point e, the second transfer signal φ2 shifts from "H" to "L". Here, the time period T(1) to perform lighting control on the light-emitting thyristor L1 is ended, and the time period T(2) to perform lighting control on the light-emitting thyristor L2 is started.

When the second transfer signal φ2 shifts from "H" to "L", the potential of the second transfer signal line 73 shifts from "H" to "L" via the φ2 terminal. As described above, the transfer thyristor T2 is turned on since the threshold voltage thereof –2.5V. This causes the potential of the first gate Gtf2 (the first gate Glf2) to become "H" (0V). Accordingly, the threshold voltage of the light-emitting thyristor T2 becomes –1.5V.

By turning on of the transfer thyristor T2, the coupling transistor Q2 shifts from the OFF state to the ON state, and thereby the potential of the first gate Gtf3 of the transfer thyristor T3 becomes –1V. Accordingly, the threshold voltage of the transfer thyristor T3 and the light-emitting thyristor L3 becomes –2.5V.

It should be noted that the threshold voltage of the transfer thyristors T and the light-emitting thyristors L having a number of 4 or more is –4.8V.

Since the potential of the light-up signal φI1 is "H" (0V), no light-emitting thyristor L emits light.

Immediately after the time point e, the transfer thyristors T1 and T2 and the coupling transistors Q1 and Q2 are in the ON state.

(6) Time Point f

At the time point f, the first transfer signal φ1 shifts from "L" to "H".

When the first transfer signal φ1 shifts from "L" to "H", the potential of the first transfer signal line 72 shifts from "L" to "H" via the φ1 terminal. Then, in the transfer thyristor T1 in the ON state, both of the anode and the cathode become "H", and the transfer thyristor T1 is turned off.

The first gate Gtf1 (the first gate Glf1) is connected to the power supply line 71 ("L" (–3.3V)) via the power supply line resistance Rg1, and also connected to the second transfer signal line 73, whose potential is at "L" (–3.3V), via the start resistance R0. Accordingly, the potential of the first gate Gtf1 (the first gate Glf1) shifts from "H" (0V) to "L" (–3.3V). Consequently, the threshold voltage of the transfer thyristor T1 and the light-emitting thyristor L1 becomes –4.8V.

Immediately after the time point f, the transfer thyristor T2 is in the ON state.

(7) Others

At the time point g, the light-up signal φI1 shifts from "H" to "L", and thereby the light-emitting thyristor L2 is turned on to be lighted (emit light) similar to the light-emitting thyristor L1 at the time point c.

Then, at the time point h, the light-up signal φI1 shifts from "L" to "H", and thereby the light-emitting thyristor L2 is turned off to be lighted off similar to the light-emitting thyristor L1 at the time point d.

Further, at the time point i, the light-up signal φI1 shifts from "H" to "L", and thereby, similar to the transfer thyristor T1 at the time point b or the transfer thyristor T2 at the time point e, the transfer thyristor T3 having a threshold voltage of –2.5V is turned on. At this time, the transfer thyristor T1 is incapable of turning on because the threshold voltage thereof is –4.8V.

At the time point i, the time period T(2) to perform lighting control on the light-emitting thyristor L2 is ended, and the time period T(3) to perform lighting control on the light-emitting thyristor L3 is started.

Hereinafter, the operations described above will be repeated.

It should be noted that, if the light-emitting thyristors L are not lighted (do not emit light) but are remained to be lighted off, as the light-up signal φI1 indicated from the time point j to the time point k in the time period T(4) to perform lighting control on the light-emitting thyristor L4 in FIG. 8, the light-up signal φI may be remained at "H" (0V). By doing so, the light-emitting thyristor L4 is remained to be lighted off though the threshold voltage thereof is –1.5V.

As described above, the transfer thyristors T are connected to each other by the coupling transistors Q. Consequently, if a former transfer thyristor T is turned on, a coupling transistor Q shifts from the OFF state to the ON state to increase a threshold voltage of a latter transfer thyristor T. Accordingly, at a timing that the first transfer signal φ1 or the second transfer signal φ2 connected to the cathode of the latter transfer thyristor T shifts from "H" (0V) to "L" (–3.3V), the latter transfer thyristor T is turned on.

When the transfer thyristor T is turned on, the potential of the first gate Gtf becomes "H" (0V). Since the first gate Gtf of the transfer thyristor T and the first gate Glf of the light-emitting thyristor L are connected to each other, the threshold voltage of the light-emitting thyristor L becomes –1.5V. Then, at a timing that the light-up signal φI shifts from "H" (0V) to "L" (–3.3V), the light-emitting thyristor L is turned on to be lighted (emit light).

In other words, by shifting to the ON state, the transfer thyristor T designates the light-emitting thyristor L as a target of the lighting control and sets the light-emitting thyristor L in a light enabled state. The light-up signal φI sets the light-emitting thyristor L in the light enabled state as the target of the lighting control to be lighted or not lighted.

In this manner, the waveform of the light-up signal φI is set in accordance with the image data to control whether or not to light up each light-emitting thyristor L.

Figure 9:
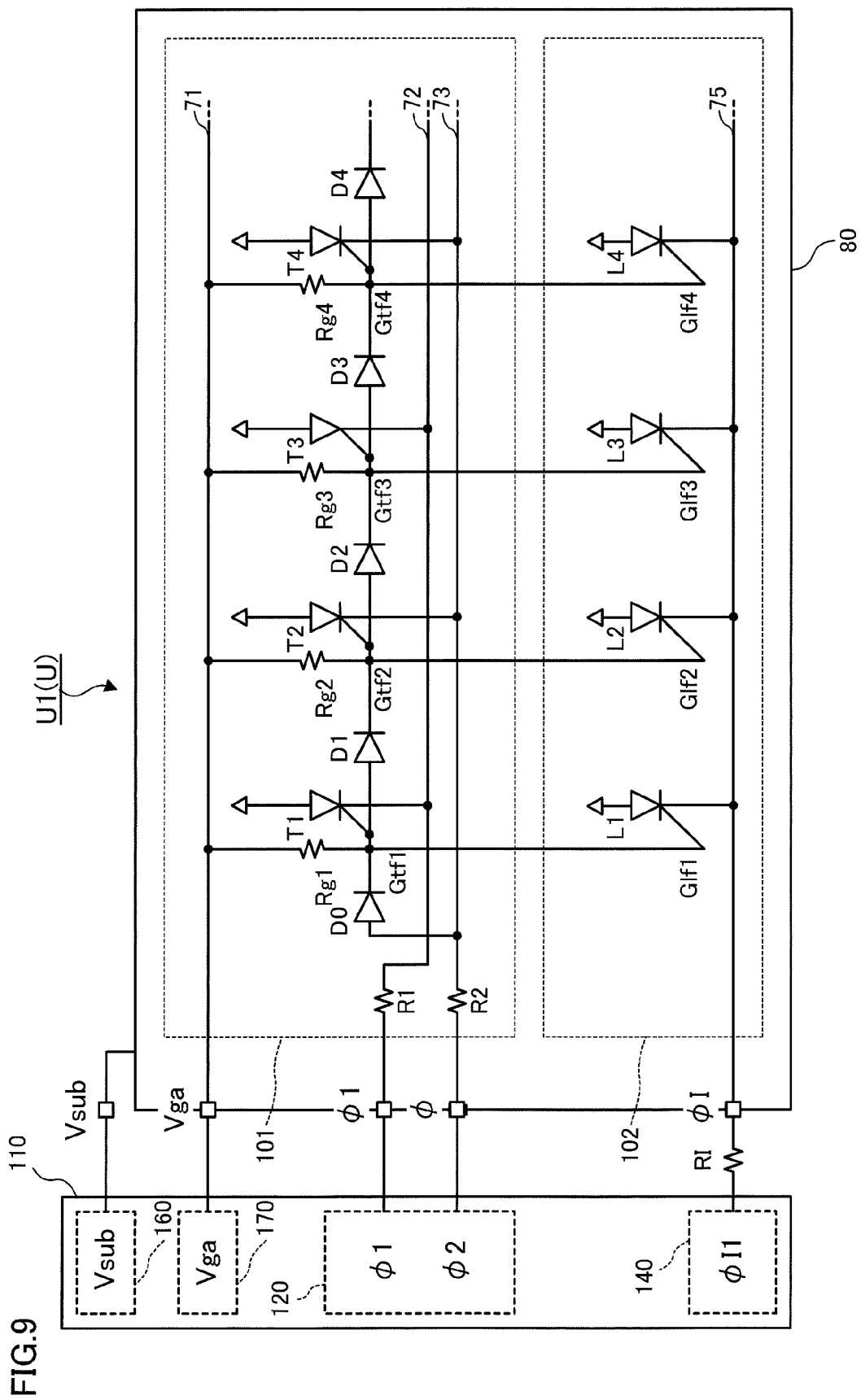
FIG. 9 is an equivalent circuit diagram for illustrating a circuit configuration of the light-emitting chip that mounts a self-scanning type light-emitting device array (SLED) to which the first exemplary embodiment is not applied.

FIG. 9 is an equivalent circuit diagram for illustrating a circuit configuration of the light-emitting chip U that mounts a self-scanning type light-emitting device array (SLED), to which the first exemplary embodiment is not applied. Here, the light-emitting chips U are also described by using the light-emitting chip U1 as a specific example in relation with the signal generating circuit 110. Thus, in FIG. 9, the light-emitting chip U is denoted as the light-emitting chip U1 (U).

In the light-emitting chip U1 (U) that mounts a self-scanning type light-emitting device array (SLED), to which the first exemplary embodiment is applied, the transfer thyristors T1, T2, T3, ... are connected via the coupling transistors Q1, Q2, Q3, .... In contrast, in the light-emitting chip U1 (U) that mounts a self-scanning type light-emitting device array (SLED), to which the first exemplary embodiment is not applied, the transfer thyristors T1, T2, T3, ... are connected via the coupling diodes D1, D2, D3, .... It should be noted that the coupling diodes D1, D2, D3, ..., when not separately distinguished, are labeled as the coupling diodes D.

When FIG. 9 is compared to FIG. 5, in the light-emitting chip U1 (U) in FIG. 9 that mounts a self-scanning type light-emitting device array (SLED), to which the first exemplary embodiment is not applied, instead of the coupling transistors Q, the coupling diodes D are provided. Then, instead of the start resistance R0, a start diode D0 is provided. Hereinafter, similar components to those of the light-emitting chip U1 (U) shown in FIG. 5 are labeled with the same reference numerals, and detailed description thereof will be omitted, and different components will be described.

The coupling diodes D1, D2, D3, ... are connected between respective pairs of two adjacent first gates Gtf taken sequentially from the first gates Gtf1, Gtf2, Gtf3, ... of the transfer thyristors T1, T2, T3, .... That is, the coupling diodes D1, D2, D3, ... are connected in series so as to be inserted between adjacent first gates Gtf1, Gtf2, Gtf3, ..., respectively. The coupling diode D1 is arranged in a direction so that a current flows from the first gate Gtf1 to the first gate Gtf2. Other coupling diodes D2, D3, D4, . . . are also arranged in the same manner.

The first gate Gtf1 of the transfer thyristor T1 on one end of the transfer thyristor array is connected to the cathode of start diode D0. The anode of the start diode D0 is connected to the second transfer signal line 73.

It should be noted that the second gate Gts of the transfer thyristor T is not used in the light-emitting chip U1 (U) that mounts a self-scanning type light-emitting device array (SLED), to which the first exemplary embodiment is not applied.

The light-emitting chip U1 (U) shown in FIG. 9 that mounts a self-scanning type light-emitting device array (SLED), to which the first exemplary embodiment is not applied also operates according to the timing chart shown in FIG. 8. Hereinafter, description will be given of the components of the light-emitting chip U1 (U) different from the light-emitting chip U1 (U) shown in FIG. 5 that mounts a self-scanning type light-emitting device array (SLED), to which the first exemplary embodiment is applied.

(1) Time Point a

As described above, the first gate Gtf1 on one end of the transfer thyristor array in FIG. 9 is connected to the cathode of the start diode D0. The first gate Gtf1 is connected to the power supply line 71 having the power supply potential Vga ("L" (−3.3V)) via the power supply line resistance Rg1. The anode of the start diode D0 is connected to the second transfer signal line 73 having a potential of "H" (0V). Accordingly, the start diode D0 has a forward bias, and thereby the potential of the cathode of the start diode D0 (the first gate Gtf1 of the transfer thyristor T1) is a value obtained by subtracting the diffusion potential Vd (1.5V) from the potential of the anode of the start diode D0 ("H" (0V)), namely, −1.5V.

Moreover, when the potential of the first gate Gtf1 of the transfer thyristor T1 becomes −1.5V, the coupling diode D1 comes to have a forward bias because the potential of the anode (the first gate Gtf1 of the transfer thyristor T1) is −1.5V and the cathode (the first gate Gtf2 of the transfer thyristor T2) is connected to the power supply line 71 of "L" (−3.3V) via the power supply line resistance Rg2. Accordingly, the potential of the first gate Gtf2 of the transfer thyristor T2 is a value obtained by subtracting the diffusion potential Vd (1.5V) from the potential of the first gate Gtf1 of the transfer thyristor T1 (−1.5V), namely, −3V.

However, the first gates Gtf of the transfer thyristors T having a number of 3 or more are not affected by the potential of the anode of the start diode D0 being "H" (0V), and the potential of these first gates Gtf is equal to "L" (−3.3V) of the power supply line 71.

Consequently, the threshold voltage of the transfer thyristor T1 and the light-emitting thyristor L1 becomes −3V, the threshold voltage of the transfer thyristor T2 and the light-emitting thyristor L2 becomes −4.5V, and the threshold voltage of the transfer thyristors T and the light-emitting thyristors L having a number of 3 or more becomes −4.8V.

(2) Time Point b

At the time point b shown in FIG. 8, the first transfer signal φ1 shifts from "H" to "L", and the potential of the first transfer signal line 72 shifts from "H" to "L". Then, the transfer thyristor T1 having a threshold voltage of −3V is turned on.

When the transfer thyristor T1 is turned on, the potential of the first gate Gtf1 (the first gate Glf1) becomes "H" (0V), which is the potential of the anode of the transfer thyristor T1. Then, the potential of the first gate Gtf2 (the first gate Glf2) becomes −1.5V, the potential of the first gate Gtf3 (the first gate Glf3) becomes −3V, and the potential of the first gates Gtf (the first gates Glf) having a number of 4 or more becomes "L" (−3.3V).

Consequently, the threshold voltage of the light-emitting thyristor L1 becomes −1.5V, the threshold voltage of the transfer thyristor T2 and the light-emitting thyristor L2 becomes −3V, the threshold voltage of the transfer thyristor T3 and the light-emitting thyristor L3 becomes −4.5V, and the threshold voltage of the transfer thyristors T and the light-emitting thyristors L having a number of 4 or more becomes −4.8V.

Immediately after the time point b, the transfer thyristor T1 is in the ON state, and other transfer thyristors T and light-emitting thyristors L are in the OFF state.

(3) Time Point c

At the time point c, the light-up signal φI1 shifts from "H" to "L", and the light-up signal line 75 shifts from "H" to "L" via the current limitation resistance RI and the φI terminal. Then, the light-emitting thyristor L1 with a threshold voltage of −1.5V is turned on, to be thereby lighted (emit light).

Immediately after the time point c, the transfer thyristor T1 is in the ON state, and the light-emitting thyristor L1 is also in the ON state and is lighted (emit light).

(4) Time Point d

At the time point d, the light-up signal φI1 shifts from "L" to "H", and thereby the light-emitting thyristor L1 is turned off, to be thereby lighted off (not lighted).

Immediately after the time point d, the transfer thyristor T1 is in the ON state.

(5) Time Point e

At the time point e, the second transfer signal φ2 shifts from "L" to "H", and accordingly, the transfer thyristor T2 with a threshold voltage of −3V is turned on. Consequently, the potential of the first gate Gtf2 (the first gate Glf2) becomes "H" (0V), the potential of the first gate Gtf3 (the first gate Glf3) becomes −1.5V, and the potential of the first gate Gtf4 (the first gate Glf4) becomes −3V. The potential of the first gates Gtf (the first gates Glf) having a number of 5 or more becomes −3.3V.

Immediately after the time point e, the transfer thyristors T1 and T2 are in the ON state.

(6) Time Point f

At the time point f, the first transfer signal φ1 shifts from "L" to "H", then both of the anode and the cathode of the transfer thyristor T1 in the ON state become "H", and accordingly the transfer thyristor T1 is turned off. Then, the potential of the first gate Gtf1 (the first gate Glf1) becomes the power supply potential Vga ("L" (−3.3V)) of the power supply line 71 via the power supply line resistance Rg1. Consequently, the coupling diode D1 comes to have a reverse bias. Accordingly, the first gate Gtf1 (the first gate Glf1) is not affected by the potential of the first gate Gtf2 (the first gate Glf2) being "H" (0V). In other words, the transfer thyristors T that include the first gates Gtf connected by the coupling diodes D with the reverse bias come to have a threshold voltage of −4.8V, and are not turned on by the first transfer signal φ1 or the second transfer signal φ2 whose potential is "L" (−3.3V).

Immediately after the time point f, the transfer thyristor T2 is in the ON state.

Thereafter, as described in the light-emitting chip U1 (U) shown in FIG. 5 that mounts a self-scanning type light-emitting element array (SLED) to which the first exemplary embodiment is applied, the above-described operations will be repeated.

In the light-emitting chip U1 (U) shown in FIG. 9 that mounts a self-scanning type light-emitting element array (SLED) to which the first exemplary embodiment is not applied, the threshold voltage of the transfer thyristors T prior to turning on is −3V. That is, the difference between the threshold voltage of the transfer thyristors T (−3V) and the potential "L" (−3.3V) of the first transfer signal φ1 and the second transfer signal φ2 is −0.3V.

In contrast, in the light-emitting chip U1 (U) shown in FIG. 5 that mounts a self-scanning type light-emitting element array (SLED) to which the first exemplary embodiment is applied, the threshold voltage of the transfer thyristors T prior to turning on is −2.5V, and therefore the difference between the threshold voltage of the transfer thyristors T (−2.5V) and the potential "L" (−3.3V) of the first transfer signal φ1 and the second transfer signal φ2 is −0.8V.

In other words, in the light-emitting chip U that mounts a self-scanning type light-emitting element array (SLED) to which the first exemplary embodiment is applied, in which the transfer thyristors T are connected by the coupling transistors Q, in comparison with the light-emitting chip U that mounts a self-scanning type light-emitting element array (SLED) to which the first exemplary embodiment is not applied, in which the transfer thyristors T are connected by the coupling diodes D, the difference between the threshold voltage of the transfer thyristors T and the potential "L" of the first transfer signal φ1 and the second transfer signal φ2 is large, and accordingly, an operation margin is wide. Consequently, the light-emitting chip U that mounts a self-scanning type light-emitting element array (SLED) to which the first exemplary embodiment is applied, in which the transfer thyristors T are connected by the coupling transistors Q, is unsusceptible to noise or the like, and occurrence of the transfer failures in the transfer portion, in which transfer (propagation) of the ON state of the transfer thyristors T is interrupted, is suppressed. Accordingly, malfunction of the print head 14 is suppressed, and thereby occurrence of disturbance in an image to be formed is suppressed.

(Method of Manufacturing Light-Emitting Chip U)

A description will be given of a method of manufacturing the light-emitting chip U to which the first exemplary embodiment is applied.

FIGS. 10A to 10D are cross-sectional views for illustrating a method of manufacturing the light-emitting chip U to which the first exemplary embodiment is applied. FIGS. 10A to 10D show a portion of the transfer thyristor T1 and the coupling transistor Q1 of the first island 301 in the cross-sectional view shown in FIG. 6B.

According to FIGS. 10A to 10D, a description will be given of a method of manufacturing the light-emitting chip U to which the first exemplary embodiment is applied. Here, it is assumed that the light-emitting chip U is manufactured by a technique of photolithography.

Figure 10A:
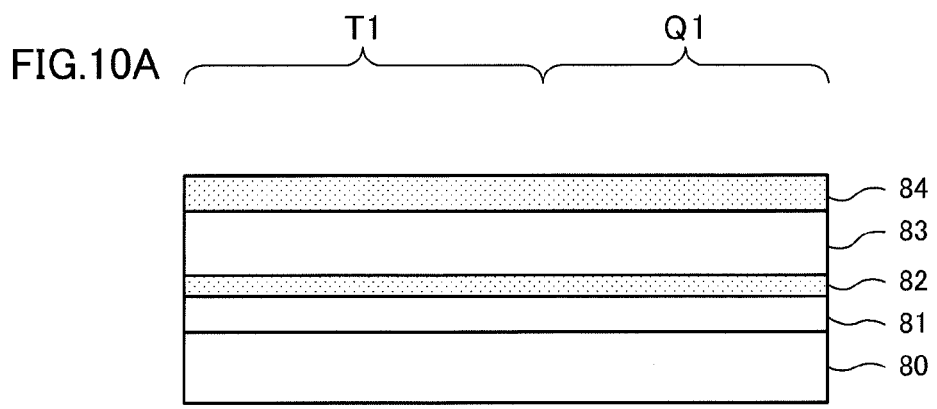
FIGS. 10A to 10D are cross-sectional views for illustrating a method of manufacturing the light-emitting chip to which the first exemplary embodiment is applied.

As shown in FIG. 10A, the light-emitting chip U is formed as a semiconductor layer stack in which the p-type first semiconductor layer 81, the n-type second semiconductor layer 82, the p-type third semiconductor layer 83 and the n-type fourth semiconductor layer 84 are laminated in order on the p-type substrate 80 by use of a compound semiconductor, such as GaAs or GaAlAs.

It should be noted that the p-type substrate 80 may also serve as the p-type first semiconductor layer 81.

Figure 10B:
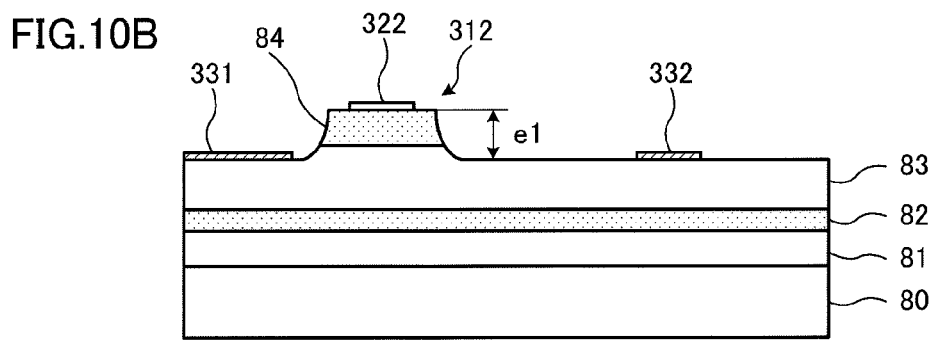

Next, as shown in FIG. 10B, an etching for providing the first gate and the collector is performed, in which a partial region of the n-type fourth semiconductor layer 84 is removed to expose the p-type third semiconductor layer 83 that forms the first gate Gtf1 of the transfer thyristor T and the collector C1 of the coupling transistor Q. It should be noted that, in the etching for providing the first gate and the collector, etching is performed by setting a target to reach an etching depth e1 from the surface of the n-type fourth semiconductor layer 84. The target etching depth e1 is set to enter into the p-type third semiconductor layer 83 side from an interface between the n-type fourth semiconductor layer 84 and the p-type third semiconductor layer 83.

In a portion where the transfer thyristor T1 is constituted, the n-type ohmic electrode 322 is formed on the region 312 of the n-type fourth semiconductor layer 84 serving as the cathode (the cathode layer). Further, on the exposed p-type third semiconductor layer 83, the p-type ohmic electrode 331 serving as the first gate Gtf1 is formed. Then, in a portion where the coupling transistor Q1 is constituted, the p-type ohmic electrode 332 serving as the collector C1 is formed on the exposed p-type third semiconductor layer 83.

Figure 10C:
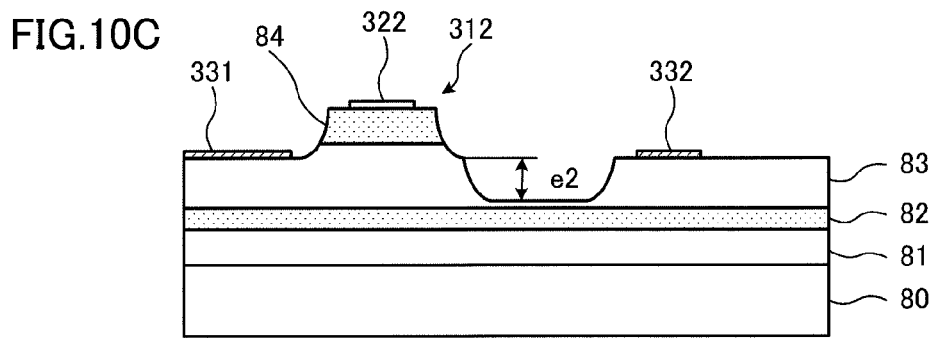

Then, as shown in FIG. 10C, a separation etching is performed to etch part of the p-type third semiconductor layer 83 for separating the first gate Gtf1 of the transfer thyristor T1 and the collector C1 of the coupling transistor Q1.

Here, etching is performed by setting a target to reach an etching depth e2 from the surface of the p-type third semiconductor layer 83, which has been exposed by removing part of the n-type fourth semiconductor layer 84. The target etching depth e2 is set to leave part of the p-type third semiconductor layer 83 on the n-type second semiconductor layer 82.

Figure 10D:
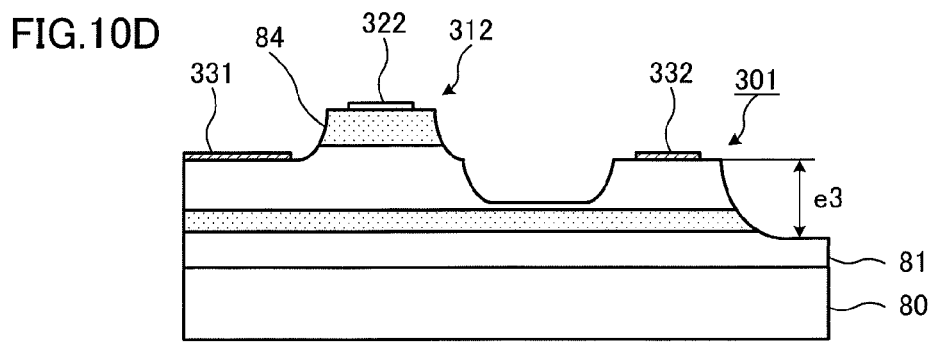

Further, as shown in FIG. 10D, an island etching is performed, in which the p-type third semiconductor layer 83, the n-type second semiconductor layer 82 and part of the p-type first semiconductor layer 81 are etched from the surface of the p-type third semiconductor layer 83 exposed by removing the n-type fourth semiconductor layer 84, to thereby form the first island 301.

Here, etching is performed by setting a target to reach an etching depth e3 from the surface of the p-type third semiconductor layer 83, which is exposed by the etching for providing the first gate and the collector. The target etching depth e3 is set to etch part of the p-type first semiconductor layer 81 in the thickness direction.

Here, though the description is given by taking the first island 301 in which the transfer thyristor T1 and the coupling transistor Q1 are constituted as a specific example, other islands (the second island to the sixth island, and islands not labeled with reference numerals) are formed in a similar manner.

An island formed by etching a semiconductor layer stack is referred to as mesa, and the island etching for forming the island is referred to as mesa etching in some cases.

Next, in the semiconductor layer stack in which the p-type semiconductor layers (the p-type first semiconductor layer 81 and the p-type third semiconductor layer 83) and the n-type semiconductor layers (the n-type second semiconductor layer 82 and the n-type fourth semiconductor layer 84) are laminated, description will be given of depletion layers formed at the interfaces of pn junctions between the p-type semiconductor layers and the n-type semiconductor layers.

Figure 11:
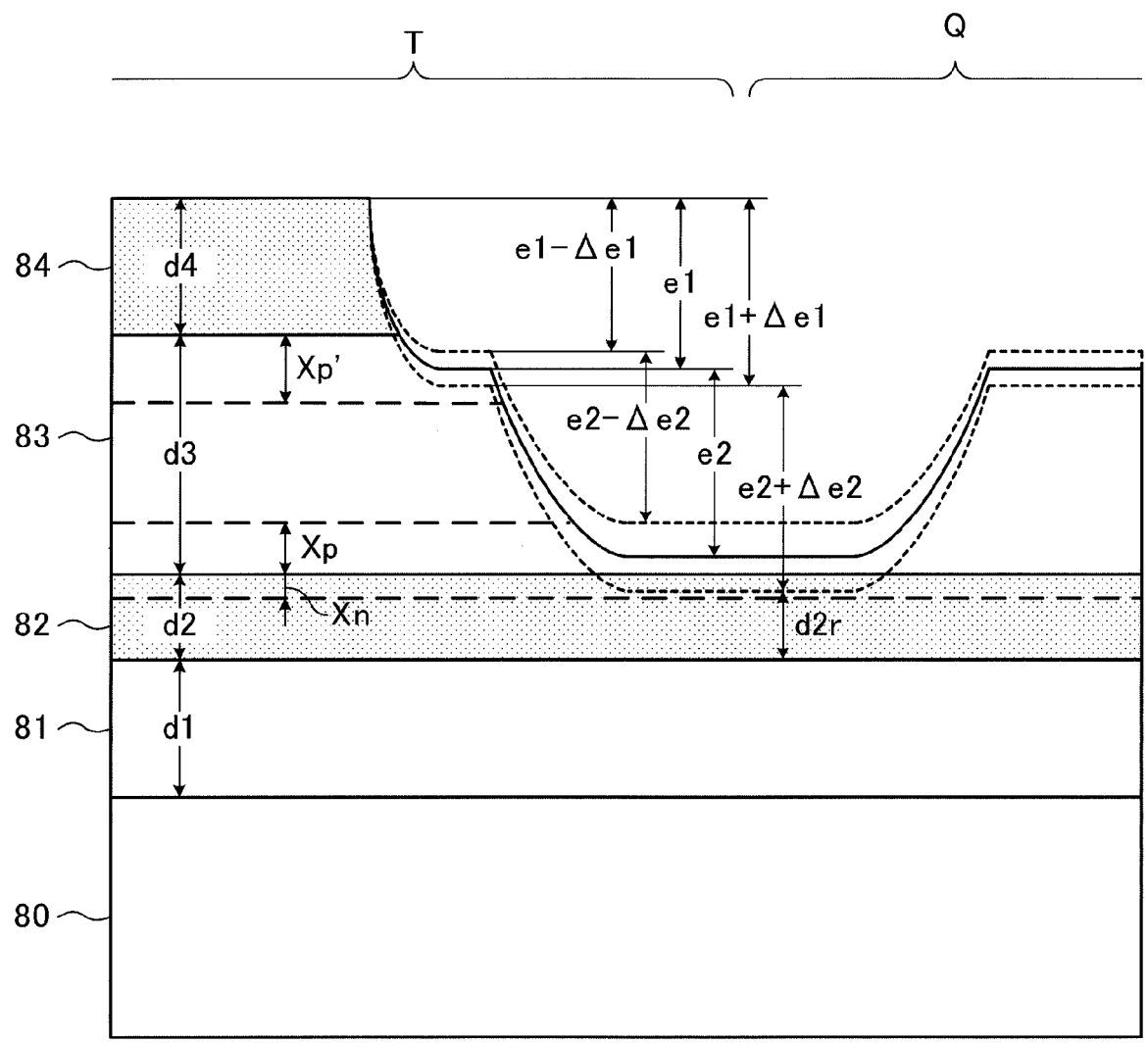
FIG. 11 is an enlarged view of a cross section of the transfer thyristor and the coupling transistor in the first exemplary embodiment.

FIG. 11 is an enlarged view of a cross section of the transfer thyristor T and the coupling transistor Q in the first exemplary embodiment. Here, it is assumed that the p-type first semiconductor layer 81 with a thickness of d1, the n-type second semiconductor layer 82 with a thickness of d2, the p-type third semiconductor layer 83 with a thickness of d3 and the n-type fourth semiconductor layer 84 with a thickness of d4 are laminated in this order on the p-type substrate 80.

Here, description will be given by the pn junction between the n-type second semiconductor layer 82 and the p-type third semiconductor layer 83. The thickness Xn of the depletion layer expanding from the interface of the pn junction toward the n-type second semiconductor layer 82 and the thickness Xp of the depletion layer expanding from the interface of the pn junction toward the p-type third semiconductor layer 83 are represented by expressions (1) and (2), respectively. The diffusion potential Vd is represented by expression (3).

The thickness Xn of the depletion layer and the thickness of the depletion layer Xp are obtained based on an elementary charge amount q, a dielectric constant E, an impurity concentration of the p-type semiconductor layer (an acceptor concentration Na), an impurity concentration of the n-type semiconductor layer (a donor concentration Nd), a Boltzmann constant K, a true carrier concentration ni and a potential Vd added to the pn junction.

In other words, at the interface between the n-type second semiconductor layer 82 and the p-type third semiconductor layer 83, the depletion layers depending on the impurity concentrations are formed.

It should be noted that, in FIG. 11, description is given of the thickness Xn of the depletion layer and the thickness Xp of the depletion layer at the interface between the n-type second semiconductor layer 82 and the p-type third semiconductor layer 83; however, the same is true for other interfaces (an interface between the p-type first semiconductor layer 81 and the n-type second semiconductor layer 82 and an interface between the p-type third semiconductor layer 83 and the n-type fourth semiconductor layer 84).

In the following description, it is assumed that the p-type first semiconductor layer 81, the n-type second semiconductor layer 82, the p-type third semiconductor layer 83 and the n-type fourth semiconductor layer 84 are composed of $Al_{0.13}Ga_{0.87}As$, the true carrier concentration ni is $1.63 \times 10^6/cm^3$ and a relative dielectric constant $\in r$ is 12.74. The dielectric constant $\in$ is a product of a vacuum dielectric constant $\in 0$ and the relative dielectric constant $\in r$.

[Expression 1]

$$Xn = \sqrt{\frac{2\varepsilon Na}{qNd(Nd+Na)} \times (Vd - Vb)} \quad (1)$$

$$Xp = \sqrt{\frac{2\varepsilon Nd}{qNa(Nd+Na)} \times (Vd - Vb)} \quad (2)$$

$$Vd = \frac{kT}{q} \times \log\left(\frac{NaNd}{ni^2}\right) \quad (3)$$

In FIG. 11, between the transfer thyristor T and the coupling transistor Q, the p-type third semiconductor layer 83 having a thickness smaller than Xp (the thickness Xp of the depletion layer) may remain on the n-type second semiconductor layer 82. This is because the p-type third semiconductor layer 83 remaining on the n-type second semiconductor layer 82 is depleted, and therefore the first gate Gtf of the transfer thyristor T and the base of the coupling transistor Q are not electrically connected.

In the etching for providing the first gate and the collector shown in FIG. 10B, in a case where etching variation is Δe1 as opposed to the target etching depth e1, an actual etching depth as opposed to the etching depth e1 exists between the shallowest etching depth (e1−Δe1) and the deepest etching depth (e1+Δe1). Here, even the actual shallowest etching depth (e1−Δe1) is larger than the thickness d4 of the n-type fourth semiconductor layer 84.

This is because, if the n-type fourth semiconductor layer 84 is not completely removed and left on the p-type third semiconductor layer 83, there is a possibility that ohmic property cannot be obtained even though the p-type ohmic electrodes 331 and 332 are formed as shown in FIG. 10B.

Then, in the separation etching shown in FIG. 10C, in a case where etching variation is Δe2 as opposed to the target etching depth e2, an actual etching depth as opposed to the etching depth e2 exists between the shallowest etching depth (e2−Δe2) and the deepest etching depth (e2+Δe2).

Then, an etching depth in which the actual shallowest etching depth in the etching for providing the first gate and the collector (e1−Δe1) and the actual shallowest etching depth in the separation etching (e2−Δe2) overlap one another (e1−Δe1+e2−Δe2) is only required to reach a position at a distance of the thickness Xp of the depletion layer toward the p-type third semiconductor layer 83 from the interface between the p-type third semiconductor layer 83 and the n-type second semiconductor layer 82.

This will suppress the depth of the n-type second semiconductor layer 82 to be etched in a small amount despite the depth in which the actual deepest etching depth in the etching for providing the first gate and the collector (e1+Δe1) and the actual deepest etching depth in the separation etching (e2+Δe2) overlap one another (e1+Δe1+e2+Δe2).

As an example in the first exemplary embodiment, the thickness (μm) and the impurity concentration (/cm³) in each of the p-type first semiconductor layer 81, the n-type second semiconductor layer 82, the p-type third semiconductor layer 83 and the n-type fourth semiconductor layer 84 shown in Table 1 are set.

The p-type first semiconductor layer 81 has a thickness d1 of 0.50 μm and an impurity concentration (an acceptor concentration Na) of $1 \times 10^{17}/cm^3$, the n-type second semiconductor layer 82 has a thickness d2 of 0.30 μm and an impurity concentration (a donor concentration Nd) of $2 \times 10^{17}/cm^3$, the p-type third semiconductor layer 83 has a thickness d3 of 0.90 μm and an impurity concentration (an acceptor concentration Na) of $4 \times 10^{16}/cm^3$ and the n-type fourth semiconductor layer 84 has a thickness d4 of 0.50 μm and an impurity concentration (a donor concentration Nd) of $2 \times 10^{18}/cm^3$. In particular, the thickness d3 of 0.90 μm of the p-type third semiconductor layer 83 is thicker than those of other layers and the impurity concentration (the acceptor concentration Na) of $4 \times 10^{16}/cm^3$ of the p-type third semiconductor layer 83 is lower than those of other layers.

In a state where no voltage is applied to the pn junction (Vb=0V), at the interface between the n-type second semiconductor layer 82 and the p-type third semiconductor layer 83, the thickness Xp of the depletion layer expanding toward the p-type third semiconductor layer 83, whose impurity concentration is small, is calculated from expression (2), and is 0.19 μm.

TABLE 1

| Function (Transfer thyristor T) | | Thickness (μm) | Impurity Concentration (/cm³) |
| --- | --- | --- | --- |
| N-type fourth semiconductor layer 84 | Cathode layer | d4 0.50 | $2 \times 10^{18}$ |
| P-type third semiconductor layer 83 | First gate layer | d3 0.90 | $4 \times 10^{16}$ |
| N-type second semiconductor layer 82 | Second gate layer | d2 0.30 | $2 \times 10^{17}$ |
| P-type first semiconductor layer 81 | Anode layer | d1 0.50 | $1 \times 10^{17}$ |

Here, it is assumed that the above-described etching is performed by wet etching that uses an etching solution (an etchant). It is also assumed that variation (accuracy) in the etching depth is ±10%.

Here, since the depth d4 of the n-type fourth semiconductor layer 84 is 0.50 μm, the target etching depth e1 of the etching for providing the first gate and the collector is set at 0.60 μm. The actual shallowest etching depth (e1−Δe1) is 0.54 μm and the actual deepest etching depth (e1+Δe1) is 0.66 μm.

In the example shown here, the thickness Xp of the depletion layer that expands toward the p-type third semiconductor layer 83 is 0.19 μm.

Accordingly, the etching depth in which the actual shallowest etching depth in the etching for providing the first gate and the collector (e1−Δe1) and the actual shallowest etching depth in the separation etching (e2−Δe2) overlap one another (e1−Δe1+e2−Δe2) may be (d4+d3−Xp) obtained by subtracting the thickness Xp of the depletion layer expanding toward the p-type third semiconductor layer 83 from a sum of the thickness d4 of the n-type fourth semiconductor layer 84 and the thickness d3 of the p-type third semiconductor layer 83.

From this, the target etching depth e2 in the separation etching becomes 0.74 μm.

Then, in the separation etching, the actual shallowest etching depth (e2−Δe2) is 0.67 μm, and the actual deepest etching depth (e2+Δe2) is 0.81 μm.

In the case of the actual shallowest etching depth in the etching for providing the first gate and the collector (e1−Δe1, 0.54 μm) and the actual shallowest etching depth in the separation etching (e2−Δe2, 0.67 μm), the etching proceeds to a depth of 1.21 μm from the surface of the n-type fourth semiconductor layer 84. The depth of 1.21 μm corresponds to a position with a distance of 0.19 μm (the thickness Xp of the depletion layer on the p-type third semiconductor layer 83 side) from the interface between the p-type third semiconductor layer 83 and the n-type second semiconductor layer 82 toward the p-type third semiconductor layer 83.

On the other hand, in the case of the actual deepest etching depth in the etching for providing the first gate and the collector (e1+Δe1, 0.66 μm) and the actual deepest etching depth in the separation etching (e2+Δe2, 0.81 μm), the etching proceeds to a depth of 1.47 μm from the surface of the n-type fourth semiconductor layer 84. The depth of 1.47 μm corresponds to a position with a distance of 0.07 μm entering toward the n-type second semiconductor layer 82 from the interface between the p-type third semiconductor layer 83 and the n-type second semiconductor layer 82. In this case, the etching removes the p-type third semiconductor layer 83 and further enters toward the n-type second semiconductor layer 82. The remaining thickness d2r of the n-type second semiconductor layer 82 becomes 0.23 μm (=0.30 μm−0.07 μm).

As described above, in the first exemplary embodiment, since the impurity concentration (the acceptor concentration Na) of the p-type third semiconductor layer 83 is $4 \times 10^{16}/\text{cm}^3$, the thickness Xp of the depletion layer is 0.19 μm in the state where no voltage is applied to the pn junction (Vb=0V). Accordingly, although part of the p-type third semiconductor layer 83 remains on the n-type second semiconductor layer 82, if the thickness of the part of the p-type third semiconductor layer 83 falls within the range of the thickness Xp of the depletion layer, electrical connection between the first gate Gtf of the transfer thyristor T and the collector C of the coupling transistor Q via the p-type third semiconductor layer 83 is suppressed.

It should be noted that the target etching depth e3 in the island etching is 1.20 μm.

Table 2 shows a specific example of the thickness and the impurity concentration of each of the p-type first semiconductor layer 81, the n-type second semiconductor layer 82, the p-type third semiconductor layer 83 and the n-type fourth semiconductor layer 84 in a case where the first exemplary embodiment is not applied.

In the case where the first exemplary embodiment is not applied, the thickness of the p-type third semiconductor layer 83 is 0.90 μm, which is same as that in the case of the Table 1 where the first exemplary embodiment is applied; however, the impurity concentration (the acceptor concentration Na) of the p-type third semiconductor layer 83 is $2 \times 10^{17}/\text{cm}^3$, which is larger than that in the case of the Table 1 where the first exemplary embodiment is applied.

In this case, in the state where no voltage is applied to the pn junction (Vb=0V), the thickness Xp of the depletion layer on the p-type third semiconductor layer 83 side is 0.07 μm. In this connection, the thickness Xn of the depletion layer on the n-type second semiconductor layer 82 side is also 0.07 μm.

TABLE 2

| | Function (Transfer thyristor T) | Thickness (μm) | Impurity Concentration (/cm³) |
|---|---|---|---|
| N-type fourth semiconductor layer 84 | Cathode layer | d4 0.50 | $2 \times 10^{18}$ |
| P-type third semiconductor layer 83 | First gate layer | d3 0.90 | $2 \times 10^{17}$ |
| N-type second semiconductor layer 82 | Second gate layer | d2 0.30 | $2 \times 10^{17}$ |
| P-type first semiconductor layer 81 | Anode layer | d1 0.50 | $1 \times 10^{17}$ |

Similar to the case of Table 1 where the first exemplary embodiment is applied, when calculation is carried on the assumption that the target etching depth e1 in the etching for providing the first gate and the collector is 0.60 μm, the target etching depth e2 in the separation etching becomes 0.88 μm.

Then, in the separation etching, the actual shallowest etching depth (e2−Δe2) becomes 0.79 μm and the actual deepest etching depth (e2+Δe2) becomes 0.97 μm.

In the case of the actual shallowest etching depth in the etching for providing the first gate and the collector (e1−Δe1, 0.54 μm) and the actual shallowest etching depth in the separation etching (e2−Δe2, 0.79 μm), the etching proceeds to a depth of 1.33 μm from the surface of the n-type fourth semiconductor layer 84. The depth of 1.33 μm corresponds to a position with a distance of 0.07 μm (the thickness Xp of the depletion layer on the p-type third semiconductor layer 83 side) from the interface between the p-type third semiconductor layer 83 and the n-type second semiconductor layer 82 toward the p-type third semiconductor layer 83.

On the other hand, in the case of the actual deepest etching depth in the etching for providing the first gate and the collector (e1+Δe1, 0.66 μm) and the actual deepest etching depth in the separation etching (e2+Δe2, 0.97 μm), the etching proceeds to a depth of 1.63 μm from the surface of the n-type fourth semiconductor layer 84. The depth of 1.63 μm corresponds to a position with a distance of 0.23 μm entering toward the n-type second semiconductor layer 82 from the interface between the p-type third semiconductor layer 83 and the n-type second semiconductor layer 82. In this case, the etching removes the p-type third semiconductor layer 83 and further enters toward the n-type second semiconductor layer 82. Since the thickness of the n-type second semiconductor layer 82 is 0.30 μm, the remaining thickness d2r of the n-type second semiconductor layer 82 becomes 0.07 μm (=0.30 μm−0.23 μm).

The second gate Gts of the transfer thyristor T and the base of the coupling transistor Q are connected via the n-type second semiconductor layer 82 (refer to FIG. 7C). Consequently, existence of the n-type second semiconductor layer 82 is required to allow electrical connection (current flow) between the second gate Gts of the transfer thyristor T and the base of the coupling transistor Q.

From this, in the case shown in Table 2 where the first exemplary embodiment is not applied, there is a possibility that the n-type second semiconductor layer 82 becomes thin and electrical connection between the second gate Gts of the transfer thyristor T and the base of the coupling transistor Q is of high resistance, and thereby a case occurs in which a current is resistant to flow.

Accordingly, in the transfer portion 101, the transfer failures occur, in which transfer (propagation) of the ON state of the transfer thyristors T becomes unstable or is interrupted, and thereby, disturbance occurs in an image to be formed.

In contrast, in the case shown in Table 1 where the first exemplary embodiment is applied, the n-type second semiconductor layer 82 is resistant to become thin, and accordingly, it is possible to suppress occurrence of the case where a current is resistant to flow between the second gate Gts of the transfer thyristor T and the base of the coupling transistor Q.

In other words, occurrence of the transfer failures, in which transfer (propagation) of the ON state of the transfer thyristors T becomes unstable or is interrupted in the transfer portion 101, is suppressed, and accordingly, occurrence of disturbance in an image to be formed is suppressed.

This is because, as shown in Tables 1 and 2, since the thickness d2 of the n-type second semiconductor layer 82 is smaller than the thickness d3 of the p-type third semiconductor layer 83, it is difficult to leave the thickness d2 of the n-type second semiconductor layer 82, which is thin, when the p-type third semiconductor layer 83 is etched.

Accordingly, in the first exemplary embodiment, the impurity concentration (the donor concentration Nd) of the p-type third semiconductor layer 83 is set to increase the thickness Xp of the depletion layer and the target etching depth e2 is set in consideration of the thickness Xp of the depletion layer, to thereby increase production margins.

It should be noted that it is possible to set the target etching depth e2 by changing the impurity concentration (the donor concentration Nd) of the p-type third semiconductor layer 83.

The above-described specific example is merely a specific example, in which the thickness of the n-type second semiconductor layer 82 remaining between the transfer thyristor T and the coupling transistor Q is set by the thickness d2 and the impurity concentration (the donor concentration Nd) of the n-type second semiconductor layer 82 and the thickness d3 and the impurity concentration (the acceptor concentration Na) of the p-type third semiconductor layer 83. It should be noted that the n-type second semiconductor layer 82 with the thickness d2 may remain without being etched between the transfer thyristor T and the coupling transistor Q so as to suppress resistance variations in the connection between the second gate Gts of the transfer thyristor T and the base of the coupling transistor Q. In other words, the p-type third semiconductor layer 83 with a thickness within the range of Xp of the depletion layer may exist on the n-type second semiconductor layer 82.

Second Exemplary Embodiment

In the first exemplary embodiment, the p-type third semiconductor layer 83 is assumed to be a layer with uniform impurity concentration (acceptor concentration).

In the first exemplary embodiment, as is learned from expression (1), the smaller the impurity concentration (the acceptor concentration), the larger the thickness Xp of the depletion layer on the p-type third semiconductor layer 83 side. However, in the transfer thyristor T, the depletion layer is also formed on the interface between the n-type fourth semiconductor layer 84, which is the cathode, and the p-type third semiconductor layer 83, which is the first gate Gtf. In addition, as shown in Table 1, the impurity concentration (the donor concentration Nd) of the n-type fourth semiconductor layer 84 is larger than the impurity concentration (the acceptor concentration Na) of the p-type third semiconductor layer 83. Accordingly, the deletion layer expands toward the p-type third semiconductor layer 83 (the thickness Xp' of the depletion layer in FIG. 11).

For example, if the impurity concentration of the p-type third semiconductor layer 83 is further declined to $2 \times 10^{16}/cm^3$, in the state where no voltage is applied to the pn junction (Vb=0V), the thickness Xp of the depletion layer expanding in the p-type third semiconductor layer 83 side on the interface between the n-type second semiconductor layer 82 and the p-type third semiconductor layer 83 becomes 0.28 μm. On the other hand, in the state where no voltage is applied to the pn junction (Vb=0V), the thickness Xp' of the depletion layer expanding in the p-type third semiconductor layer 83 side on the interface between the n-type fourth semiconductor layer 84 and the p-type third semiconductor layer 83 becomes 0.30 μm. Accordingly, the sum of the thickness Xp of the depletion layer and the thickness Xp' of the depletion layer is 0.58 μm. That is, of the thickness d3 of the p-type third semiconductor layer 83, which is 0.9 μm, 0.58 μm is depleted.

Then, when a negative voltage is applied to the n-type fourth semiconductor layer 84 side, on the interface between the n-type second semiconductor layer 82 and the p-type third semiconductor layer 83, the depletion layer in the p-type third semiconductor layer 83 side is further expanded. The depletion layer connects to the depletion layer that expands in the p-type third semiconductor layer 83 side on the interface between the n-type fourth semiconductor layer 84 and the p-type third semiconductor layer 83. When the depletion layers are connected to each other, punch through, that is avalanche breakdown, is caused, and thereby the transfer thyristor T no longer has its functionality.

In other words, by declining the impurity concentration (the acceptor concentration Na) of the p-type third semiconductor layer 83, a withstand voltage of the transfer thyristor T is decreased.

Accordingly, for suppressing decrease of the withstand voltage of the transfer thyristor T, it is unfavorable to unnecessarily decline the impurity concentration (the acceptor concentration Na) of the p-type third semiconductor layer 83.

In the second exemplary embodiment, the p-type third semiconductor layer 83 is configured with two layers with different impurity concentrations (a p-type third semiconductor layer 83a and a p-type third semiconductor layer 83b).

Since the other configurations are same as those in the first exemplary embodiment, description thereof will be omitted, and description will be given with a focus on the p-type third semiconductor layer 83 that is a different portion.

Figure 12:
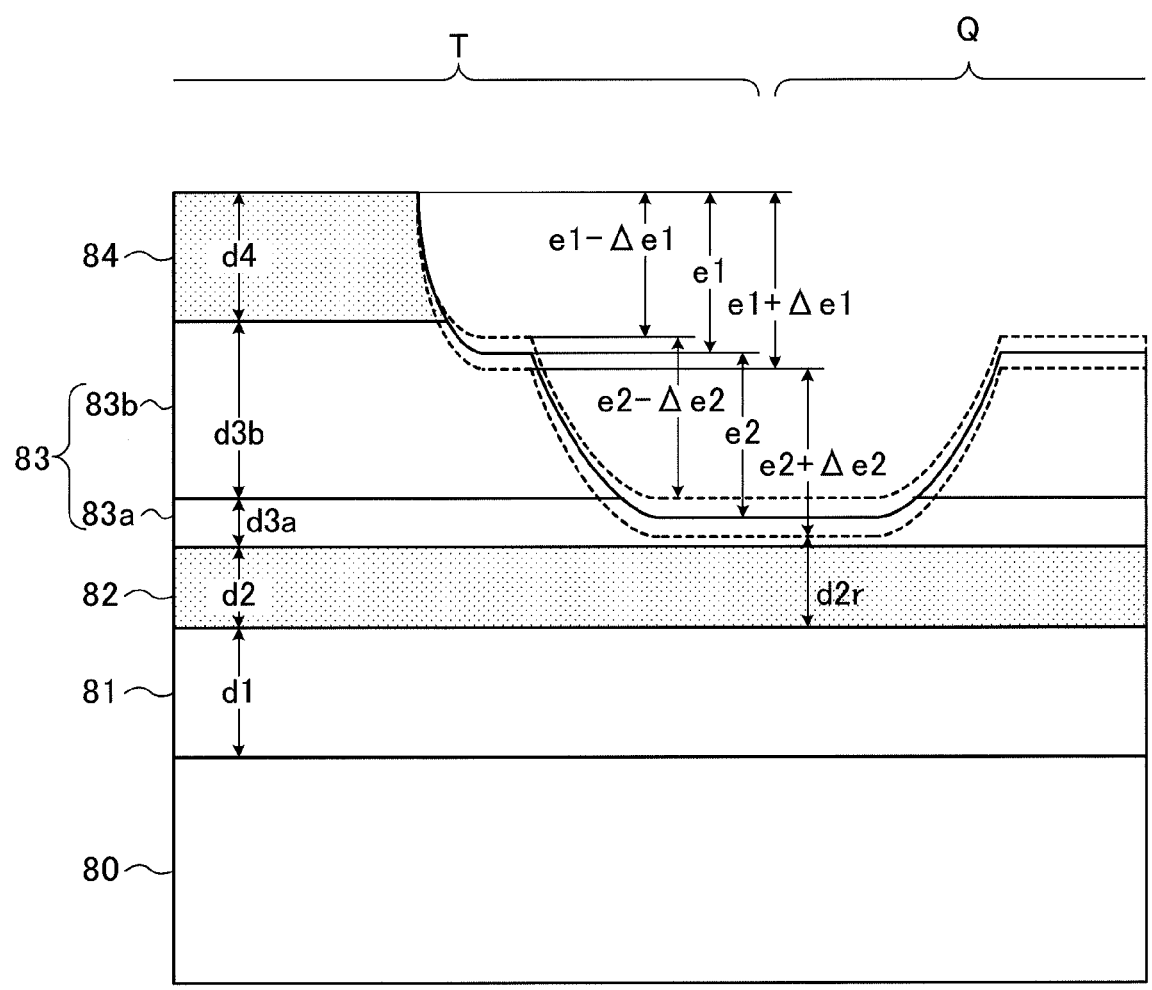
FIG. 12 is an enlarged view of a cross section of a transfer thyristor and a coupling transistor in a second exemplary embodiment.

FIG. 12 is an enlarged view of a cross section of a transfer thyristor T and a coupling transistor Q in the second exemplary embodiment. Similar components to those of the cross section of the transfer thyristor T and the coupling transistor Q in the first exemplary embodiment shown in FIG. 11 are labeled with the same reference symbols, and detailed description thereof will be omitted.

In the second exemplary embodiment, the p-type third semiconductor layer 83 is configured with two layers, namely, the p-type third semiconductor layer 83a as a specific example of a third semiconductor layer lower layer on the n-type second semiconductor layer 82 side (a first gate lower layer of the transfer thyristor T) and the p-type third semiconductor layer 83b as a specific example of a third semiconductor layer upper layer on the n-type fourth semiconductor layer 84 side (a first gate upper layer of the transfer thyristor T).

As an example in the second exemplary embodiment, the thickness (μm) and the impurity concentration (/cm$^3$) are set in each of the p-type first semiconductor layer 81, the n-type second semiconductor layer 82, the p-type third semiconductor layer 83a, the p-type third semiconductor layer 83b and the n-type fourth semiconductor layer 84 shown in Table 3.

The p-type third semiconductor layer 83a has a thickness d3a of 0.30 μm and an impurity concentration (an acceptor concentration Na) of $1 \times 10^{16}$/cm$^3$, and the p-type third semiconductor layer 83b has a thickness d3b of 0.60 μm and an impurity concentration (an acceptor concentration Na) of $4 \times 10^{17}$/cm$^3$.

In this case, in the state where no voltage is applied to the pn junction (Vb=0V), the thickness Xp of the depletion layer in the p-type third semiconductor layer 83a is 0.41 μm according to expression (2), and consequently, the p-type third semiconductor layer 83a having the thickness d3a of 0.30 μm is entirely depleted.

However, the p-type third semiconductor layer 83b has the impurity concentration (the acceptor concentration Na) ($4 \times 10^{17}$/cm$^3$) larger than the impurity concentration (the acceptor concentration Na) of the p-type third semiconductor layer 83a ($1 \times 10^{16}$/cm$^3$), and therefore, expansion of the depletion layer is suppressed. Accordingly, occurrence of punch through is suppressed, and thereby decrease of the withstand voltage of the transfer thyristor T is suppressed.

TABLE 3

| | Function (Transfer thyristor T) | Thickness (μm) | Impurity Concentration (/cm$^3$) |
|---|---|---|---|
| N-type fourth semiconductor layer 84 | Cathode layer | d4 0.50 | $2 \times 10^{18}$ |
| P-type third semiconductor layer 83b | First gate upper layer | d3b 0.60 | $4 \times 10^{17}$ |
| P-type third semiconductor layer 83a | First gate lower layer | d3a 0.30 | $1 \times 10^{16}$ |
| N-type second semiconductor layer 82 | Second gate layer | d2 0.30 | $2 \times 10^{17}$ |
| P-type first semiconductor layer 81 | Anode layer | d1 0.50 | $1 \times 10^{17}$ |

In the second exemplary embodiment, an etching depth in which the actual shallowest etching depth in the etching for providing the first gate and the collector (e1−Δe1) and the actual shallowest etching depth in the separation etching (e2−Δe2) overlap one another (e1−Δe1+e2−Δe2) is only required to reach the interface between the p-type third semiconductor layer 83a and the p-type third semiconductor layer 83b.

In other words, in the case of Table 3, the etching depth (e1−Δe1+e2−Δe2) may be 1.10 μm.

Similar to the case where the first exemplary embodiment is applied, if it is assumed that the target etching depth e1 in the etching for providing the first gate and the collector is 0.60 μm, the target etching depth e2 in the separation etching may be 0.62 μm. The actual shallowest etching depth (e2−Δe2) becomes 0.56 μm and the actual deepest etching depth (e2+Δe2) becomes 0.68 μm in the separation etching.

Accordingly, in the case of the actual shallowest etching depth in the etching for providing the first gate and the collector (e1−Δe1, 0.54 μm) and the actual shallowest etching depth in the separation etching (e2−Δe2, 0.56 μm), the etching proceeds to a depth of 1.10 μm from the surface of the n-type fourth semiconductor layer 84. The depth of 1.10 μm corresponds to a position of the interface between the p-type third semiconductor layer 83a and the p-type third semiconductor layer 83b.

On the other hand, in the case of the actual deepest etching depth in the etching for providing the first gate and the collector (e1+Δe1, 0.66 μm) and the actual deepest etching depth in the separation etching (e2+Δe2, 0.68 μm), the etching proceeds to a depth of 1.34 μm from the surface of the n-type fourth semiconductor layer 84. The depth of 1.34 μm corresponds to a position with a distance of 0.06 μm entering toward the p-type third semiconductor layer 83a from the interface between the p-type third semiconductor layer 83a and the n-type second semiconductor layer 82. In this case, part of the p-type third semiconductor layer 83a (the thickness of 0.06 μm) remains on the n-type second semiconductor layer 82. That is, the n-type second semiconductor layer 82 is not etched.

Accordingly, it is possible to suppress the n-type second semiconductor layer 82 between the transfer thyristor T and the coupling transistor Q thinning, and accordingly to suppress the current resistant to flow between the second gate Gts of the transfer thyristor T and the base of the coupling transistor Q.

In the first and second exemplary embodiments, etching is performed as a wet etching that uses an etching solution (an etchant); however, the etching may be performed as a dry etching that uses plasmarized reactive gas.

In the first and second exemplary embodiments, description has been given on the assumption that the thyristor (the transfer thyristor T and the light-emitting thyristor L) is anode common in which the anode is connected to the substrate 80 and the coupling transistor Q is a pnp bipolar transistor. The thyristor (the transfer thyristor T and the light-emitting thyristor L) may be cathode common in which the cathode is connected to the substrate 80 and the coupling transistor Q may be an npn bipolar transistor by changing the polarity of the circuit.

Then, in the first and second exemplary embodiments, a light-emitting element is assumed to be the light-emitting thyristor L; however, the light-emitting element may be a light-emitting diode (LED) in which p-type semiconductor layers and n-type semiconductor layers are laminated.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting component comprising:
a plurality of light-emitting thyristors, each configured with a semiconductor layer stack in which a first semiconductor layer of a first conduction type, a second semiconductor layer of a second conduction type, which is different from the first conduction type, a third semiconductor layer of the first conduction type and a fourth semiconductor layer of the second conduction type are laminated in order, each of the plurality of light-emitting thyristors emitting light at a predetermined wavelength in an ON state;
a plurality of transfer thyristors, each configured with the semiconductor layer stack, the plurality of transfer thyristors shifting to the ON state in order so as to transfer the ON state, to thereby set corresponding light-emitting thyristors in a light-enabled state in the plurality of light-emitting thyristors; and
a plurality of coupling transistors, each configured with the first semiconductor layer, the second semiconductor layer and the third semiconductor layer in the semiconductor layer stack, provided to couple a former transfer thyristor and a latter transfer thyristor that are adjacent in order that the plurality of transfer thyristors sequentially shift to the ON state, and shifting to the ON state affected by the former transfer thyristor shifting to the ON state, the first semiconductor layer and the second semiconductor layer of each coupling transistor being continued to the first semiconductor layer and the second semiconductor layer of the former transfer thyristor and the third semiconductor layer of each coupling transistor being continued to the third semiconductor layer of the former transfer thyristor with a thickness to be depleted in a state where no voltage is applied.

2. The light-emitting component according to claim 1, wherein the third semiconductor layer is configured with a third semiconductor layer lower layer on a side of the second semiconductor layer and a third semiconductor layer upper layer on a side of the fourth semiconductor layer, an impurity concentration of the third semiconductor layer upper layer is higher than that of the third semiconductor layer lower layer, the third semiconductor layer lower layer has a thickness depleted in a state where no voltage is applied, and part of the third semiconductor layer lower layer in a thickness direction on the second semiconductor layer is continued between the former transfer thyristor and the coupling transistor coupled thereto in the former transfer thyristors in the plurality of transfer thyristors and the plurality of coupling transistors.

3. A print head comprising:
a light-emitting unit including:
a plurality of light-emitting thyristors, each configured with a semiconductor layer stack in which a first semiconductor layer of a first conduction type, a second semiconductor layer of a second conduction type, which is different from the first conduction type, a third semiconductor layer of the first conduction type and a fourth semiconductor layer of the second conduction type are laminated in order, each of the plurality of light-emitting thyristors emitting light at a predetermined wavelength in an ON state;
a plurality of transfer thyristors, each configured with the semiconductor layer stack, the plurality of transfer thyristors shifting to the ON state in order so as to transfer the ON state, to thereby set corresponding light-emitting thyristors in a light-enabled state in the plurality of light-emitting thyristors; and
a plurality of coupling transistors, each configured with the first semiconductor layer, the second semiconductor layer and the third semiconductor layer in the semiconductor layer stack, provided to couple a former transfer thyristor and a latter transfer thyristor that are adjacent in order that the plurality of transfer thyristors sequentially shift to the ON state, and shifting to the ON state affected by the former transfer thyristor shifting to the ON state, the first semiconductor layer and the second semiconductor layer of each coupling transistor being continued to the first semiconductor layer and the second semiconductor layer of the former transfer thyristor and the third semiconductor layer of each coupling transistor being continued to the third semiconductor layer of the former transfer thyristor with a thickness to be depleted in a state where no voltage is applied; and
an optical unit that forms an image with light emitted from the light-emitting unit.

4. An image forming apparatus comprising:
an image carrier;
a charging unit that charges the image carrier;
an exposure unit that includes a light-emitting section and exposes the image carrier charged by the charging unit with light emitted by the light-emitting section through an optical section, the light-emitting section including:
a plurality of light-emitting thyristors, each configured with a semiconductor layer stack in which a first semiconductor layer of a first conduction type, a second semiconductor layer of a second conduction type, which is different from the first conduction type, a third semiconductor layer of the first conduction type and a fourth semiconductor layer of the second conduction type are laminated in order, each of the plurality of light-emitting thyristors emitting light at a predetermined wavelength in an ON state;
a plurality of transfer thyristors, each configured with the semiconductor layer stack, the plurality of transfer thyristors shifting to the ON state in order so as to transfer the ON state, to thereby set corresponding light-emitting thyristors in a light-enabled state in the plurality of light-emitting thyristors; and
a plurality of coupling transistors, each configured with the first semiconductor layer, the second semiconductor layer and the third semiconductor layer in the semiconductor layer stack, provided to couple a former transfer thyristor and a latter transfer thyristor that are adjacent in order that the plurality of transfer thyristors sequentially shift to the ON state, and shifting to the ON state affected by the former transfer thyristor shifting to the ON state, the first semiconductor layer and the second semiconductor layer of each coupling transistor being continued to the first semiconductor layer and the second semiconductor layer of the former transfer thyristor and the third semiconductor layer of each coupling transistor being continued to the third semiconductor layer of the former transfer thyristor with a thickness to be depleted in a state where no voltage is applied;
a developing unit that develops an electrostatic latent image formed on the image carrier by exposure of the exposure unit; and
a transfer unit that transfers an image developed on the image carrier onto a transferred body.

5. A method of manufacturing a light-emitting component including a plurality of light-emitting thyristors, a plurality of transfer thyristors and a plurality of coupling transistors, the method comprising:
- forming a semiconductor layer stack by laminating a first semiconductor layer, a second semiconductor layer, a third semiconductor layer and a fourth semiconductor layer in order, by which the plurality of light-emitting thyristors and the plurality of transfer thyristors are configured;
- forming the plurality of coupling transistors by performing etching on a partial region of the fourth semiconductor layer to expose the third semiconductor layer;
- separating the plurality of transfer thyristors and the plurality of coupling transistors by performing etching on a partial region of the third semiconductor layer to leave a thickness to be depleted in a state where no voltage is applied in a case of shallowest etching; and
- performing etching to reach the first semiconductor layer and forming a plurality of island regions, each configured by combining each of the plurality of light-emitting thyristors, each of the plurality of transfer thyristors and each of the plurality of coupling transistors.

* * * * *